US012731654B2

(12) United States Patent
Yoon et al.

(10) Patent No.: US 12,731,654 B2

(45) Date of Patent: Sep. 8, 2026

(54) WORDLINE DEFECT DETECTION CIRCUIT, WORDLINE DEFECT DETECTION METHOD, AND MEMORY DEVICE INCLUDING THE SAME

(71) Applicant: Samsung Electronics Co., Ltd., Suwon-si (KR)

(72) Inventors: Jayang Yoon, Suwon-si (KR); Seongjin Kim, Suwon-si (KR); Chihyun Kim, Suwon-si (KR); Junehong Park, Suwon-si (KR); Hyeongdo Choi, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 39 days.

(21) Appl. No.: 18/403,091

(22) Filed: Jan. 3, 2024

(65) Prior Publication Data

US 2024/0233850 A1 Jul. 11, 2024

(30) Foreign Application Priority Data

Jan. 5, 2023 (KR) ........................ 10-2023-0001957

(51) Int. Cl.
*G11C 8/08* (2006.01)
*G11C 29/12* (2006.01)

(52) U.S. Cl.
CPC .................. *G11C 29/12005* (2013.01); *G11C 2029/1202* (2013.01)

(58) Field of Classification Search
None
See application file for complete search history.

(56) References Cited

U.S. PATENT DOCUMENTS

| | | | |
|---|---|---|---|
| 7,532,513 B2 | 5/2009 | Chen et al. | |
| 8,432,732 B2 | 4/2013 | Li et al. | |
| 9,460,786 B2 | 10/2016 | Kang | |
| 9,704,542 B2 | 7/2017 | Yamada | |
| 9,903,901 B2 | 2/2018 | Jeon et al. | |
| 10,008,276 B2 | 6/2018 | Huynh et al. | |
| 11,404,138 B2 | 8/2022 | Lakshminarayana Addagalla et al. | |
| 2010/0125429 A1* | 5/2010 | Yamada ................ | G11C 29/02 365/185.18 |

(Continued)

OTHER PUBLICATIONS

Extended European Search Report dated Jul. 5, 2024 issued in Europeran Application No. 24150057.8-1211.

(Continued)

*Primary Examiner* — Alfredo Bermudez Lozada
(74) *Attorney, Agent, or Firm* — Harness, Dickey & Pierce, P.L.C.

(57) ABSTRACT

A word line defect detection circuit configured to detect a defect of at least one word line selected from a plurality of word lines of a memory device includes a current generating circuit configured to generate a detection reference current having a first magnitude and to apply the detection reference current to the selected word line, and a sensing amplifier configured to measure a voltage of the selected word line generated based on the detection reference current. The word line defect detection circuit may be configured to detect a defect of the selected word line in response to the voltage of the selected word line having a value less than a first reference voltage.

20 Claims, 17 Drawing Sheets

(56) References Cited

U.S. PATENT DOCUMENTS

2011/0194360 A1 8/2011 Yamada
2012/0008410 A1 1/2012 Huynh et al.
2012/0218833 A1* 8/2012 Yamada .................. G11C 7/06
365/226
2014/0133249 A1 5/2014 Yamada
2022/0044758 A1 2/2022 Son et al.
2022/0051741 A1* 2/2022 Choi ................ G11C 29/12015

OTHER PUBLICATIONS

Korean Office Action dated Jul. 24, 2026 for corresponding Korean Patent Application No. 10-2023-0001957 and its English-language translation.

* cited by examiner

WORDLINE DEFECT DETECTION CIRCUIT, WORDLINE DEFECT DETECTION METHOD, AND MEMORY DEVICE INCLUDING THE SAME

CROSS-REFERENCE TO RELATED APPLICATION

This application is based on and claims priority under 35 USC § 119 to Korean Patent Application No. 10-2023-0001957, filed on Jan. 5, 2023, in the Korean Intellectual Property Office, the disclosure of which is incorporated by reference herein in its entirety.

BACKGROUND

Various example embodiments relate to a word line defect detection circuit, a word line defect detection method and/or a metho of fabricating a semiconductor device, and/or a memory device including the same, and more particularly, to a circuit and/or method for determining whether a word line is defective by applying a particular current to the word line, and measuring a change in voltage of the word line according to the applied current.

Recently developed memory devices have the form of 3D memory devices. As the number of stacked layers of a 3D memory cell array increases, a lower gate layer may become thinner and an insulating layer separating word lines may be destroyed, resultantly causing defects, such as a short circuit, between word lines.

In order to determine defects of word lines, in the related art, a preset voltage is applied for a certain period of time and whether a leakage current occurs is determined. However, in the related art, a preset voltage has to be applied for a certain period of time, and it may take a long time to determine defects of word lines.

Therefore, there is a need or a desire for a technology to reduce the time required or used to determine defects of word lines.

SUMMARY

Various example embodiments provide a method of detecting whether a word line is defective through a change in voltage of the word line based on a current applied, after discharging the word line.

Various example embodiments may reduce the time required or used to detect a defect of a word line through the word line defect detection method, as compared with the related art.

According to some example embodiments, there is provided a word line defect detection circuit configured to detect a defect of at least one word line, which is a first word line selected from a plurality of word lines of a memory device. The word line detect detection circuit includes a current generating circuit configured to discharge current the selected first word line, to generate a detection reference current having a first magnitude, and to apply the detection reference current to the selected first word line; and a sensing amplifier configured to measure a voltage of the selected first word line, the voltage generated based on the detection reference current. In response to determining that the voltage according to application of the detection reference current to the selected first word line has a value less than a first reference voltage, the word line defect detection circuit is configured to detect a defect existing in the selected first word line, and in response to the voltage of the selected first word line is equal to the first reference voltage, the word line defect detection circuit is configured to determine that the selected first word line is not defective.

Alternatively or additionally according to some example embodiments, there is provided a word line defect detection method that detects a defect of at least one first word line selected from a plurality of word lines of a memory device. The word line defect detection method includes generating a detection reference current having a first magnitude; applying the detection reference current to the selected first word line; measuring a voltage of the selected first word line generated based on the detection reference current; and detecting a defect of the selected first word line upon determining that the voltage of the selected first word line has a value less than a reference voltage. In the detecting of the defect of the selected first word line, in response to the voltage of the selected first word line being equal to the reference voltage, the selected first word line is determined to not be defective.

Alternatively or additionally according to various example embodiments, there is provided a memory device including a circuit for detecting a defect of at least one selected word line among a plurality of word lines. The memory device includes a current generating circuit configured to generate a detection reference current having a first magnitude and to apply the detection reference current to the selected word line; and a sensing amplifier configured to measure a voltage of the selected word line generated based on the detection reference current. In response to determining that the voltage of the selected word line has a value less than a first reference voltage, the memory device is configured to detect a defect of the selected word line.

BRIEF DESCRIPTION OF THE DRAWINGS

Various example embodiments will be more clearly understood from the following detailed description taken in conjunction with the accompanying drawings in which.

DETAILED DESCRIPTION OF VARIOUS EXAMPLE EMBODIMENTS

Terms used in this specification are briefly described, and some example embodiments are described in detail.

Figure 1:
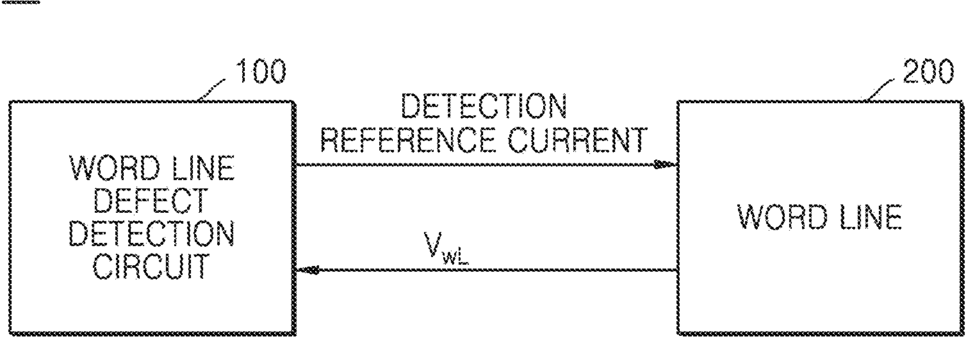
FIG. 1 is a block diagram of a memory device according to various example embodiments.

FIG. 1 is a block diagram of a memory device 10 according to various example embodiments.

Referring to FIG. 1, a memory device 10 according to various example embodiments may include a word line defect detection circuit 100 and a word line 200.

The word line defect detection circuit 100 according to various example embodiments may be electrically connected to at least one selected word line 200, among a plurality of word lines existing in the memory device 100, and detect a defect of the selected word line 200. For example, the word line defect detection circuit 100 may detect whether a connection occurs in the selected word line 200, whether a short such as a hard or soft short occurs in the selected word line 200, and/or whether the selected word line 200 is open.

The word line defect detection circuit 100 according to various example embodiments may generate a detection reference current and may apply or may supply the generated detection reference current to the selected word line 200. When the detection reference current is applied, the selected word line 200 according to various example embodiments may have a certain voltage level and may transfer the voltage level thereof to the word line defect detection circuit 100. The word line defect detection circuit 100 according to various example embodiments may determine whether a defect exists in the selected word line 200 based on the received voltage level of the selected word line 200. A configuration of the word line defect detection circuit 100 according to various example embodiments is described in detail with reference to FIGS. 2 and 3.

The selected word line 200 according to various example embodiments may be included in or connected to a plurality of memory cells present in the memory device 10. The selected word line 200 according to various example embodiments may be one of a plurality of word lines existing in or associated with a gate of a memory cell of the memory device 100. Although not shown in FIG. 1, the memory device 10 according to various example embodiments may measure the amount of current applied to the selected word line 200, may predict whether at least one of memory blocks included in the memory cell is a bad block, and may set at least one memory block to a bad block, thereby preventing or reducing data loss, for example by indicating that such a block should not be written to and/or read from.

The memory device 10 according to various example embodiments may include volatile memories, such as one or more of a static random access memory (SRAM), dynamic random access memory (DRAM), a latch, a flip-flop, a register, and the like, or nonvolatile memories, such as NAND flash memory, vertical NAND (VNAND), NOR flash memory, resistive random access memory (RRAM), phase-change memory (PRAM), magnetoresistive random access memory (MRAM), ferroelectric random access memory (FRAM), spin transfer torque random access memory (STT-RAM), and the like.

Figure 2:
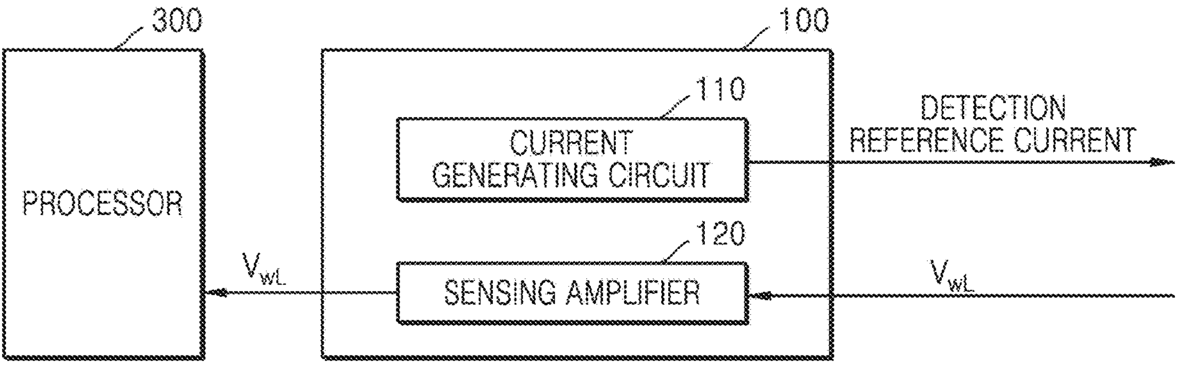
FIG. 2 is a block diagram illustrating a configuration of a word line defect detection circuit according to various example embodiments.

FIG. 2 is a block diagram illustrating a configuration of the word line defect detection circuit 100 according to various example embodiments.

Referring to FIG. 2, the word line defect detection circuit 100 according to various example embodiments may include a current generating circuit 110 or a sensing amplifier 120. Also, the word line defect detection circuit 100 according to various example embodiments may transmit a word line voltage level $V_{wL}$ received from a word line to a processor 300. The word line defect detection circuit 100 according to various example embodiments may determine whether a defect exists in a selected word line based on whether a voltage based on the application of a detection reference current for the selected word line has a value less than a reference voltage.

The current generating circuit 110 according to various example embodiments may discharge the selected word line, may generate the detection reference current having a magnitude such as a dynamically determined (or, alternatively, preset) magnitude, and may apply the generated detection reference current to the selected word line 200. For example, in order to select at least one of a plurality of word lines and determine a defect of the selected word line 200, the current generating circuit 110 may set the voltage of the selected word line 200 to a ground GND level and then apply or supply a first current to the selected word line.

The detection reference current according to various example embodiments may have the same magnitude as that of leakage current of the word line. For example, the word line defect detection circuit 100 may generate the detection reference current set to have the same magnitude as that of the leakage current to be detected from the selected word line 200, and may detect a word line with a defect, while applying the generated detection reference current to each of the word lines. The current according to various example embodiments may not be a fixed value, and may be set to a current having the same magnitude as that of the leakage current of the word line. The magnitude may be determined dynamically and/or may be calculated and/or input, e.g. from a user; however, example embodiments are not limited thereto.

The sensing amplifier 120 according to various example embodiments may measure the voltage level $V_{wL}$ of the selected word line generated based on the detection reference current. For example, the word line defect detection circuit 100 may select at least one of the word lines, and may apply the detection reference current to the selected word line 200. When the detection reference current is applied, the selected word line 200 may have the voltage level $V_{wL}$ according to the application of the detection reference current.

An initial voltage of the selected word line 200 according to various example embodiments may be set to the ground (GND) voltage. For example, the voltage of the selected word line 200 may be set to the ground (GND) level, and the voltage may be increased according to the application of the detection reference current may be measured as the voltage level $V_{wL}$ of the selected word line 200. According to various example embodiments, the selected word line 200 may transfer the voltage $V_{wL}$ according to the application of the detection reference current to the processor 300.

The word line defect detection circuit 100 according to various example embodiments may be configured to detect a defect of the selected word line 200 when the voltage $V_{wL}$ according to the application of the detection reference current to the selected word line is determined to have a value less than the first reference voltage. For example, the word line defect detection circuit 100 may transfer the voltage level $V_{wL}$ of the selected word line 200 to the processor 300, and when the voltage level $V_{wL}$ of the selected word line 200 is determined to have a value less than the reference voltage, the processor 300 may determine that the selected word line 200 is defective. The reference voltage according to various example embodiments may be a value set as a voltage that each of the word lines in the memory device 10 may have when none are defective. The reference voltage according to various example embodiments may be a value that is set based on characteristics of the selected word line 200. For example, the reference voltage may be set to a voltage level according to the detection reference current that may be derived based on resistance characteristics of the selected word line 200.

The word line defect detection circuit 100 according to various example embodiments may be configured to determine that the selected word line 200 is not defective when the voltage of the selected word line 200 reaches the particular reference voltage. For example, when the voltage of the selected word line 200 reaches the reference voltage, the processor 300 may determine that the selected word line 200 is not defective, and may perform a defect detection operation on word lines other than the selected word line. For example, the word line defect detection circuit 100 may be configured to perform a selection operation on at least one second word line from among the word lines, and may apply the detection reference current to the selected second word line when the selected first word line is determined not to be defective. Here, the first word line and the second word line are merely terms for distinguishing the selected word lines, among the word lines, and may or may not be neighboring word lines, e.g. word lines within the same bank or block.

The processor 300 according to various example embodiments may receive the voltage level $V_{wL}$ of the selected word line 200 from the word line defect detection circuit 100 and may determine whether the selected word line 200 is defective. In FIG. 2, the processor 300 according to various example embodiments is shown as existing outside the word line defect detection circuit 100, but is not limited thereto, and may be or may at least partially be provided inside the word line defect detection circuit 100. Also, the processor 300 according to various example embodiments may provide a result of determining whether the selected word line 200 is defective to the word line defect detection circuit 100.

The processor 300 according to various example embodiments may measure a time taken for the voltage of the selected word line 200 to reach the reference voltage according to the application of the detection reference current. The processor 300 according to various example embodiments may determine, as a first arrival time, the time for which the voltage of the selected word line 200 according to the application of the detection reference current reaches the reference voltage, and may set the first arrival time as a first reference for detecting whether the selected word line 200 is defective. The first reference according to various example embodiments may be a reference for determining whether other word lines are defective when no defect exists in the selected word line 200.

When the detection reference current is applied to the selected word line 200, the processor 300 according to various example embodiments may measure a second arrival time for the voltage of the selected word line 200 to reach the reference voltage. According to various example embodiments, the second arrival time may be a time taken for the voltage of the selected word line 200 to reach the reference voltage when the detection reference current is applied to the selected word line 200 having a defect.

According to various example embodiments, the first arrival time may be determined as a first reference, and the first reference may be compared with the second arrival time. For example, when it is determined that the second arrival time is greater than the first reference, the processor 300 may determine that the selected word line 200 is defective. When it is determined that the second arrival time taken for the voltage level $V_{wL}$ of the selected word line 200 to reach the reference voltage according to various example embodiments exceeds the first arrival time, the processor 300 according to various example embodiments may determine that the selected word line 200 is defective, and may transmit a determination result to the word line defect detection circuit 100. For example, when it is determined that the second arrival time taken for the voltage level $V_{wL}$ of the selected word line 200 to reach the reference voltage exceeds the first reference, the word line defect detection circuit 100 according to various example embodiments may determine that the selected word line 200 is defective, e.g. may have a short circuit or be in a short circuit state.

When the processor 300 determines that the second arrival time according to various example embodiments is less than a second reference, it may be determined that the selected word line 200 is in an open state. The second reference according to various example embodiments may be or may be based on a minimum time taken for a word line, which is determined not to be defective as a result of applying the detection reference current to at least one of the word lines, to reach the reference voltage. For example, when the processor 300 determines that the time for a voltage level Vselect_WL of the selected word line 200 as a result of applying the detection reference current to the selected word line 200 is less than the minimum time for another word line determined not to be defective to reach the reference voltage, the processor 300 may determine that the selected word line 200 is in an open state.

According to various example embodiments, the voltage level $V_{wL}$ of the selected word line 200 may be transferred to the processor 300, and whether the selected word line 100 is defective may be determined by the processor 300. Alternatively or additionally, the processor 300 according to various example embodiments may transfer a determination result to the word line defect detection circuit 100.

Figure 3:
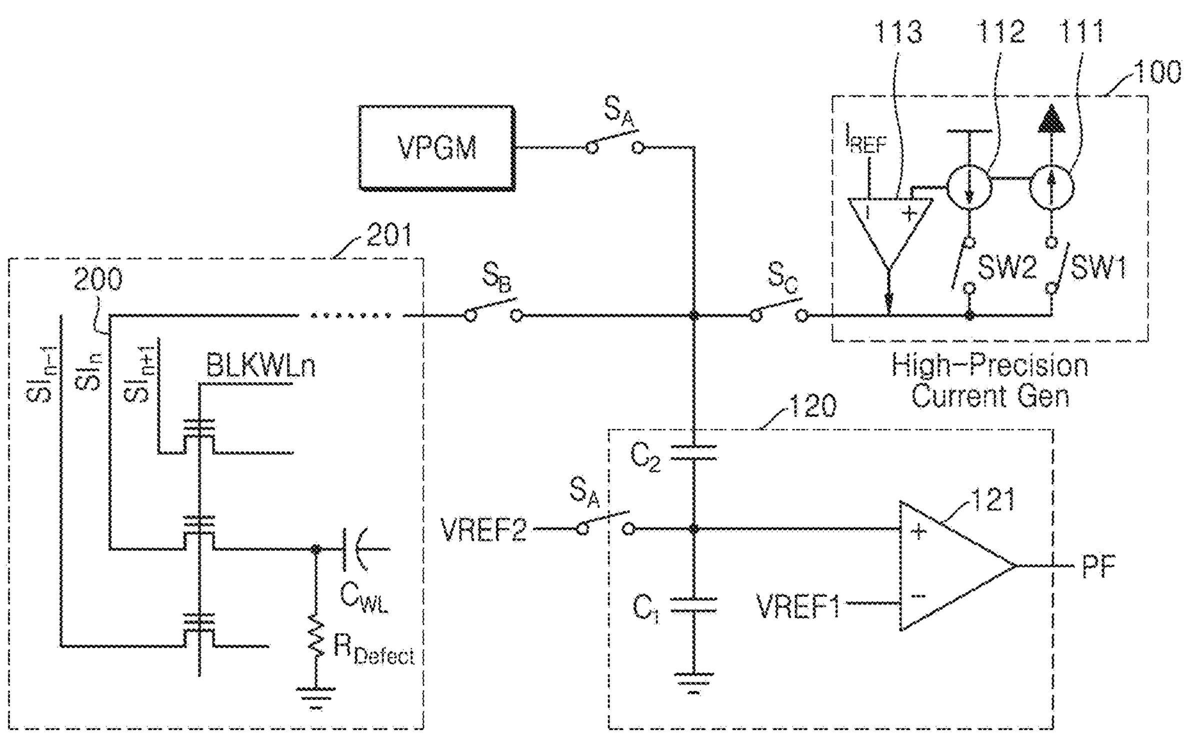
FIG. 3 is a circuit diagram of a word line defect detection circuit according to various example embodiments.

FIG. 3 is a circuit diagram of a word line defect detection circuit 100 according to various example embodiments.

Referring to FIG. 3, the word line defect detection circuit 100 according to various example embodiments may be connected to the selected word line 200 of a memory block 201 including a plurality of word lines. Also, the word line defect detection circuit 100 according to various example embodiments may include the current generating circuit 110 and the sensing amplifier 120.

The current generating circuit 110 according to various example embodiments may include a first current source 111, a second current source 112, or a first comparator 113.

Each of the first current source 111 and the second current source 112 according to various example embodiments may be implemented as an active element and/or a passive element. The first current source 111 and the second current source 112 according to various example embodiments may form or be arranged as a latch structure. In some example embodiments, currents respectively generated by the first current source 111 and the second current source 112 according to various example embodiments may be controlled by a first switch SW1 and a second switch SW2, respectively. The first current source 111 and the second current source 112 according to various example embodiments may form a latch structure with each other to adjust the amount of current to be applied to the selected word line 200. The current generating circuit 110 according to various example embodiments may be a high-precision current generating circuit having a size such as a dynamically determined (or, alternatively, preset) size. The latch structure including the first current source 111 and the second current source 112 according to various example embodiments may output current generated antagonistically by the first current source 111 and the second current source 112, e.g. of opposite sign and/or of opposite phase. The currents generated by the first current source 111 and the second current source 112 may be DC currents; however, example embodiments are not limited thereto.

The first comparator 113 according to various example embodiments may be configured to compare an output current from a latch circuit with a reference current $I_{REF}$ and generate a detection reference current based on a comparison result. For example, the first comparator according to various example embodiments may receive the output current from the latch circuit and the reference current $I_{REF}$ as inputs, and compare the output current from the latch circuit with the reference current $I_{REF}$. When the output current from the latch circuit exceeds the reference current $I_{REF}$ as a result of the comparison, the first comparator 113 may set the output current from the latch circuit to an output of the current generating circuit 110. For example, when the output current from the latch circuit exceeds the reference current $I_{REF}$, the current generating circuit 110 according to various example embodiments may output the output current from the latch circuit, as the detection reference current.

In the first current source 111, second current source 112, and first comparator 113 described above, the terms of the first and second are simply used to distinguish the components of the word line defect detection circuit 100 from each other.

The sensing amplifier 120 according to various example embodiments may include a first capacitor $C_1$, a second capacitor $C_2$, and a second comparator 121. The first and second capacitors $C_1$ and $C_2$ may be planar capacitors; however, example embodiments are not limited thereto.

The first capacitor $C_1$ according to various example embodiments may be connected to the second capacitor $C_2$ so to divide the voltage of the selected word line 200. The second comparator 121 according to various example embodiments may receive the voltage $V_{wL}$ of the selected word line 200 from the first capacitor $C_1$ and the second capacitor $C_2$. The second comparator 121 according to various example embodiments may receive the voltage $V_{wL}$ of the selected word line 200 and a reference voltage such as a dynamically determined (or, alternatively, preset) reference voltage VREF1 as inputs, and compare the voltage $V_{wL}$ of the selected word line 200 with the reference voltage VREF1. As a result of the comparison, the second comparator 121 may determine, as an output of the sensing amplifier, a greater value from among the voltage $V_{wL}$ of the selected word line 200 and the reference voltage VREF1. The sensing amplifier 120 according to various example embodiments may determine whether the selected word line 200 is defective based on an output voltage PF (or pass-fail output voltage PF).

For example, the processor 300 may receive the output voltage PF, and when the processor 300 determines that the voltage $V_{wL}$ of the selected word line 200 has a value greater than the reference voltage VREF1 before the first arrival time, the processor 300 may determine that the selected word line 200 is not defective. However, when the processor 300 determines that the voltage $V_{wL}$ of the selected word line 200 has a value greater than the reference voltage VREF1 after the first arrival time, the processor 300 according to various example embodiments may determine that the selected word line 200 is defective.

The memory block 201 according to various example embodiments may include at least one word line block BLKWLn, and each word line block may include a plurality of word lines $Sl_{n-1}$, $Sl_n$, and $Sl_{n+1}$. In some example embodiments, when a defect does not exist in at least one word line according to various example embodiments is not defective, only a capacitor component $C_{WL}$ (such as DRAM capacitor components and/or parasitic capacitor components) of the word line may be detected, but when a defect exists in at least one word line according to various example embodiments, the defective word line may be determined to have a defective resistor $R_{Defect}$.

The word line defect detection circuit 100 according to various example embodiments may be connected to a program voltage generator VPGM, and a base voltage VREF2 for circuit driving may be applied. The base voltage VREF2 according to various example embodiments may be 1.9V, but is not limited thereto. Alternatively or additionally, the word line defect detection circuit 100 according to various example embodiments may be connected to a selected word line through a select switch $S_B$, and may be connected to the program voltage generator VPGM and a base voltage supply source by at least one switch $S_A$. Alternatively or additionally, the current generating circuit 110 may be connected to the sensing amplifier 120 by a sensing switch $S_C$.

Figure 4:
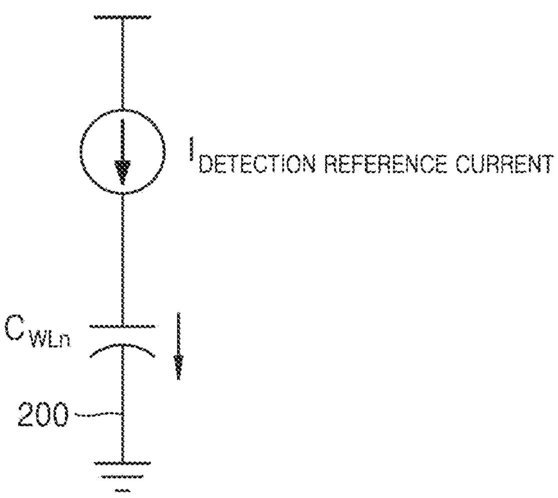
FIG. 4 is a circuit diagram of a word line without a defect according to various example embodiments.
Figure 5:
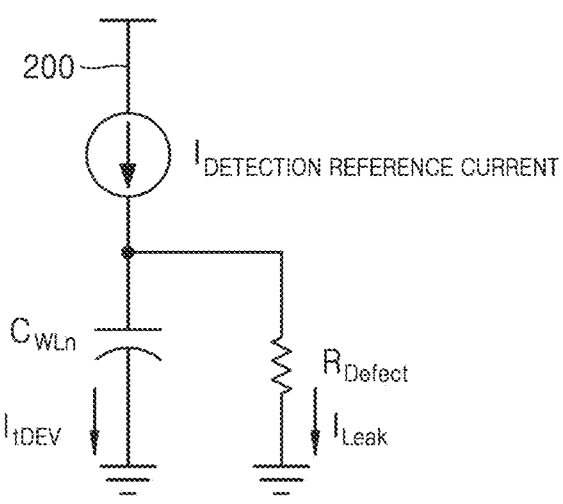
FIG. 5 is a circuit diagram of a word line having a defect, according to various example embodiments.

FIG. 4 is a circuit diagram of a word line without a defect according to various example embodiments, and FIG. 5 is a circuit diagram of a word line with a defect according to various example embodiments.

Referring to FIG. 4, when a defect does not exist in the selected word line 200 according to various example embodiments, only the capacitor component $C_{WL}$ of the word line may be detected. However, referring to FIG. 5, when a defect exists in the selected word line 200 according to various example embodiments, the processor 300 may determine that the defect resistance $R_{Defect}$ exists in the defective word line.

In a case in which a defect exists in the selected word line 200 according to various example embodiments, when the detection reference current is applied, leakage current $I_{Leak}$ may occur in the selected word line 200. When leakage current $I_{Leak}$ occurs in the selected word line 200, a time tDEV for the voltage of the selected word line 200 to reach the reference voltage may have a value greater than the first reference. According to various example embodiments, the time tDEV for the voltage of the selected word line 200 to reach the reference voltage may vary depending on whether a word line is defective.

Figure 6:
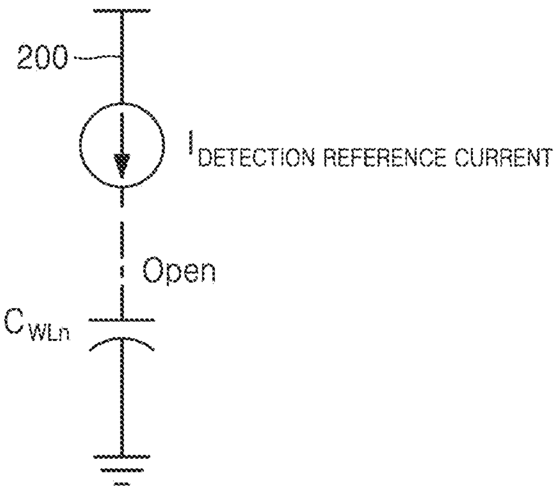
FIG. 6 is a circuit diagram in which a word line is open, according to various example embodiments.

FIG. 6 is a circuit diagram when a word line is open according to various example embodiments.

Referring to FIG. 6, when the selected word line 200 according to various example embodiments is open, even if the detection reference current is applied to the selected word line 200, the detection reference current cannot flow through the selected word line 200. According to various example embodiments, when the selected word line 200 is open, the processor 300 may determine that the voltage of the selected word line 200 according to the application of the detection reference current reaches the reference voltage at a time faster than the second reference.

When the processor 300 determines that the second arrival time according to various example embodiments is less than the second reference, the processor 300 may determine that the selected word line 200 is in an open state. The second reference according to various example embodiments may be or may be based on a minimum time for a word line determined not to be defective to reach the reference voltage as a result of applying the detection reference current to at least one of the word lines. For example, when it is determined that the time for the voltage level $V_{wL}$ of the selected word line 200 as a result of applying the detection reference current to the selected word line 200 to reach the reference voltage is less than the time for the word line determined not to be defective to reach the reference voltage, it may be determined that the selected word line 200 is in an open state.

Figure 7:
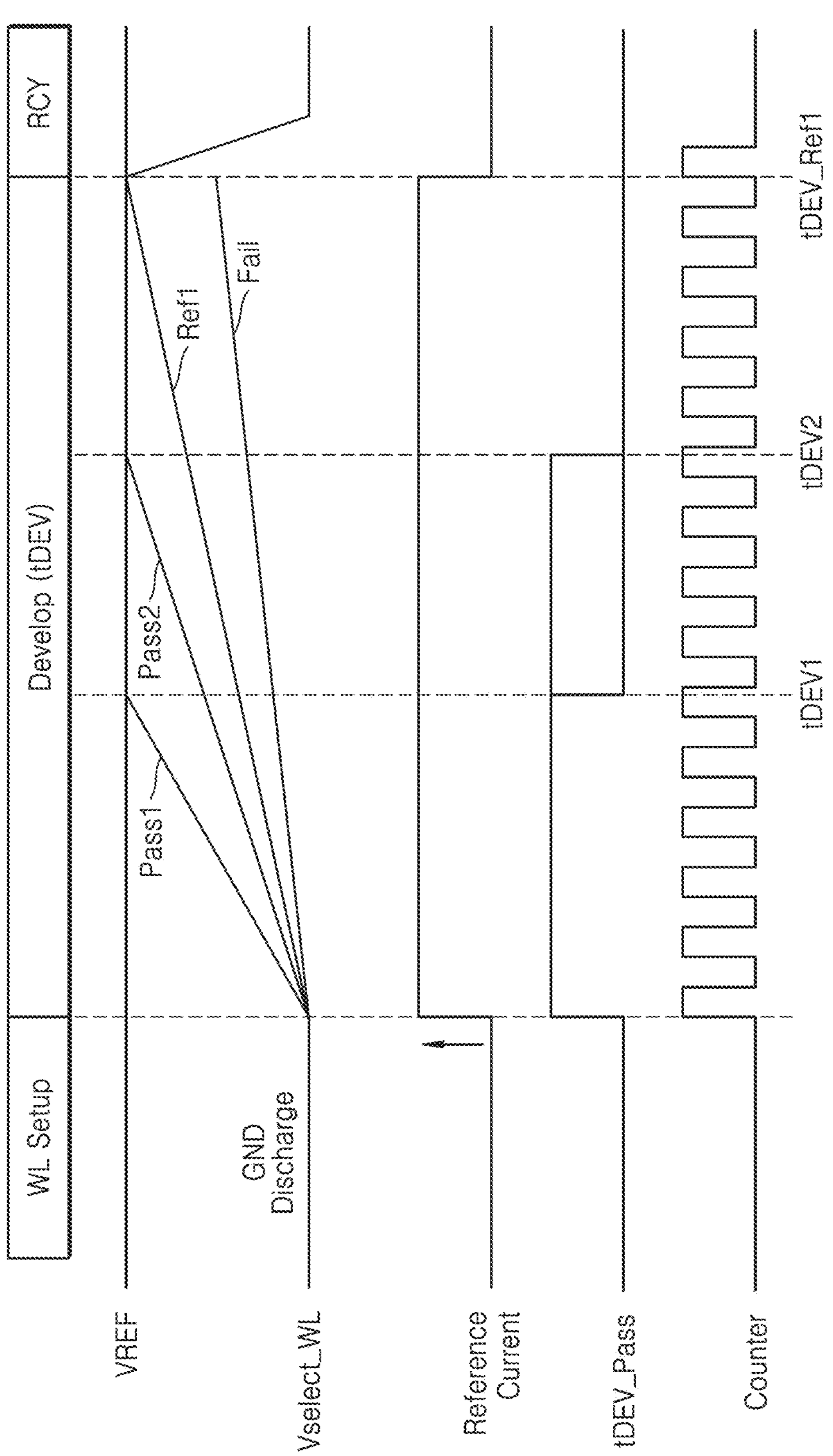
FIG. 7 is a timing diagram of a word line defect detection method according to various example embodiments.

FIG. 7 is a timing diagram of a word line detect detection method according to various example embodiments.

Referring to FIG. 7, the word line defect detection method according to various example embodiments may be divided into a word line setup period WL Setup a detection reference current application period Develop (tDEV), and a recovery period RCY.

The word line defect detection circuit 100 according to various example embodiments may discharge the voltage Vselect_WL of the selected word line to a ground GND level in the word line setup period WL Setup. Also, the word line defect detection circuit 100 according to various example embodiments may not apply the detection reference current in the word line setup period WL Setup.

The word line defect detection circuit 100 according to various example embodiments may apply the detection reference current to the selected word line in a detection reference current application period Develop (tDEV).

When the detection reference current is applied, the voltage Vselect_WL of the selected word line according to various example embodiments may start to increase. The word line defect detection circuit 200 according to various example embodiments may measure the time tDEV for the voltage Vselect_WL of the selected word line to reach the reference voltage VREF1. For example, the word line defect detection circuit 100 may include a counter and may measure a time for the voltage Vselect_WL of the selected word line to reach the reference voltage VREF1 by generating clock signals at regular intervals.

When the detection reference current is applied to the word line without a defect, the word line defect detection circuit 100 according to various example embodiments may determine a time for the voltage Vselect_WL of the selected word line to reach the reference voltage VREF1, as a first arrival time tDEV, and may set the first arrival time tDEV_Ref1 to a first reference Ref1 for detecting whether the selected word line 200 is defective.

The word line defect detection circuit 100 according to various example embodiments may select at least one word line from among the word lines, and the time for each of the selected word lines to reach the reference voltage VREF1 may be different. For example, when the detection reference current is applied to a first word line and a second word line, among the word lines, the time tDEV1 for the voltage of the first word line to reach the reference voltage VREF1 and the time tDEV2 for the voltage of the second word line to reach the reference voltage VREF1 may be different. According to various example embodiments, when the time tDEV1 for the voltage of the first word line to reach the reference voltage VREF1 and the time tDEV2 for the voltage of the second word line to reach the reference voltage VREF1 are both less than the first reference Ref1, the first word line and the second word line may be determined not to be defective (Pass1 and Pass2).

According to various example embodiments, when the time tDEV1 for the voltage of the third word line to reach the reference voltage VREF1 and the time tDEV2 for the voltage of the second word line to reach the reference voltage VREF1 exceed the first reference Ref1, the third word line may be determined to be defective (Fail).

The terms of the first word line, the second word line, and the third word line according to various example embodiments are simply used to distinguish the word lines from each other.

Figure 8:
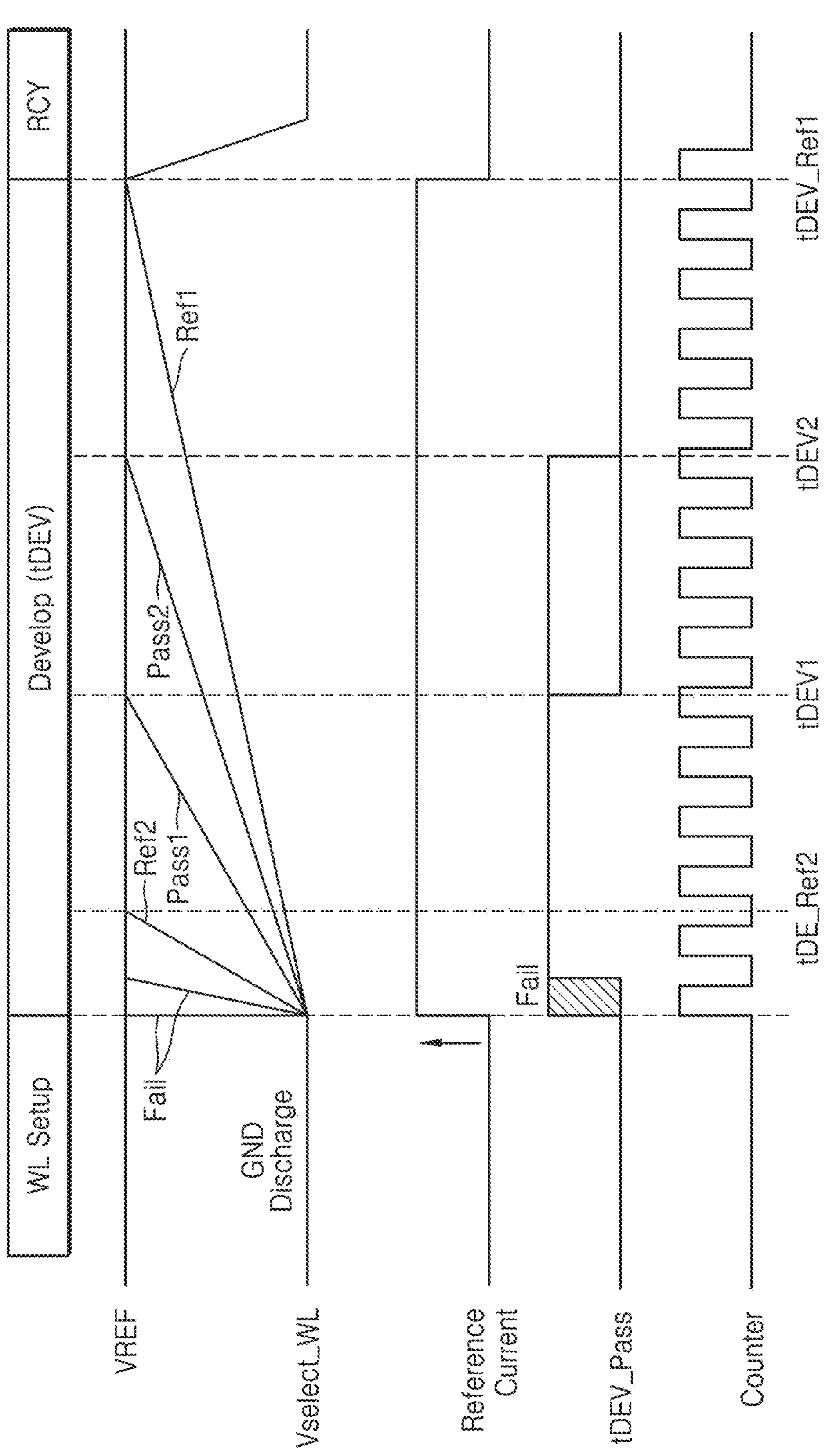
FIG. 8 is a timing diagram illustrating detection of an open word line in a word line defect detection method according to various example embodiments.

FIG. 8 is a timing diagram illustrating detection of an open word line in a word line defect detection method according to various example embodiments.

Referring to FIG. 8, the word line defect detection circuit 100 according to various example embodiments may set a second reference Ref2 to detect an open word line. The second reference Ref2 according to various example embodiments may be or may be based on a minimum time tDEV_Ref2 for a word line determined not to be defective as a result of applying the detection reference current to at least one word line from among a plurality of word lines to reach the reference voltage. For example, when a time for the voltage level Vselect_WL of the selected word line 200 as a result of applying the detection reference current to the selected word line 200 to reach the reference voltage is less than a minimum time tDEV_Ref2 for another word line determined not to be defective to reach the reference voltage, the selected word line 200 may be determined to be in an open state (Fail).

According to various example embodiments, when the time tDEV1 for the voltage of the first word line to reach the reference voltage VREF1 and the time tDEV2 for the voltage of the second word line to reach the reference voltage VREF1 are less than the first reference Ref1 and exceed the second reference Ref2, the first word line and the second word line may be determined not to be defective (Pass1 and Pass2).

Figure 9:
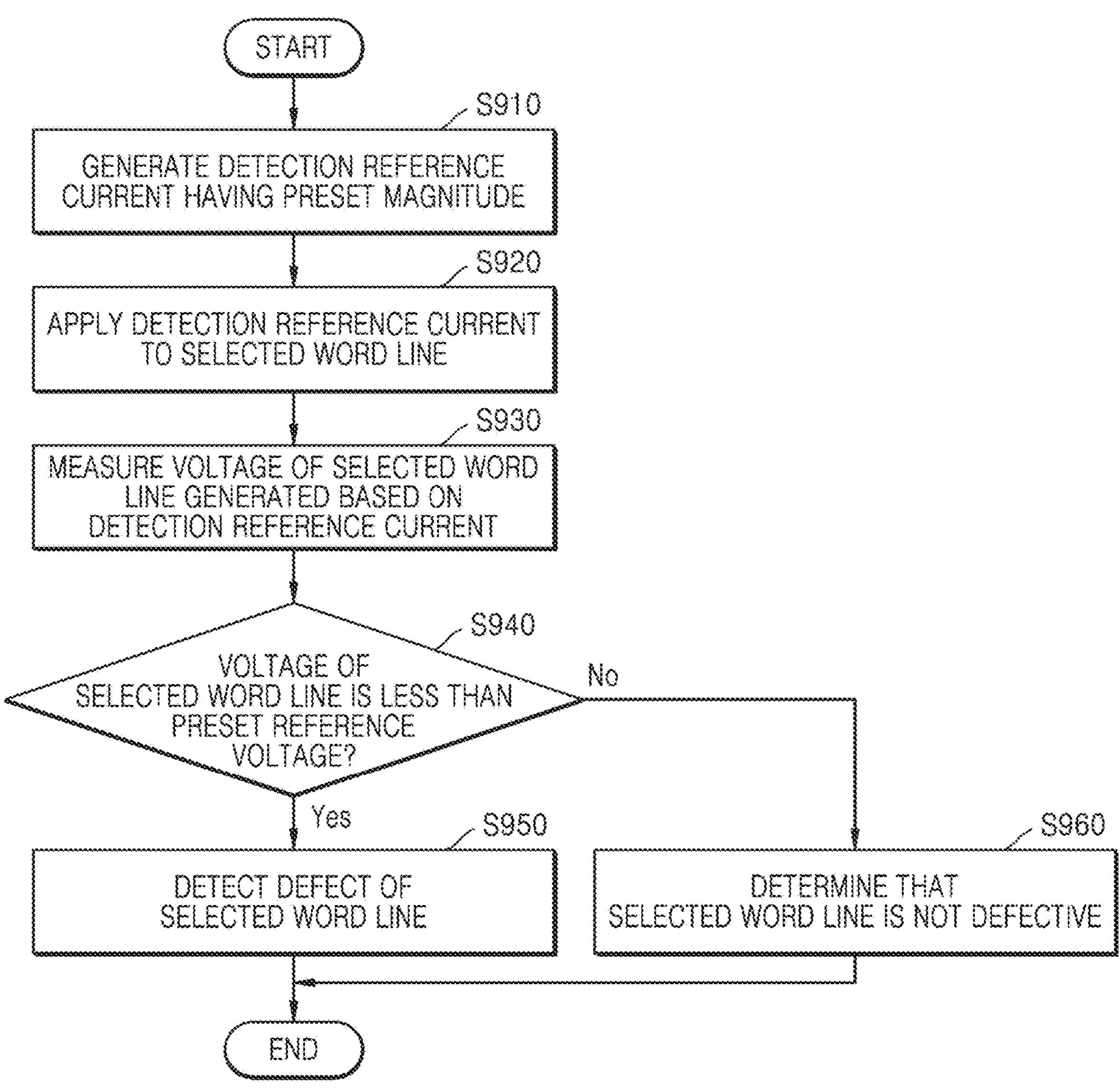
FIG. 9 is a flowchart of a word line defect detection method according to various example embodiments.

FIG. 9 is a flowchart of a word line defect detection method according to various example embodiments.

Referring to FIG. 9, the word line defect detection circuit 100 according to various example embodiments may generate the detection reference current having a particular magnitude (S910).

The word line defect detection circuit 100 according to various example embodiments may discharge a selected word line in order to detect a defect of the selected word line. For example, the word line defect detection circuit 100 may set the voltage level of the selected word line 200 to ground (GND). The detection reference current according to various example embodiments may have the same magnitude as that of the leakage current of the word line. For example, the word line defect detection circuit 100 may generate the detection reference current set to have the same magnitude as that of the leakage current to be detected from the selected word line, and may detect a defective word line, while applying the generated detection reference current to each of the word lines. The current according to various example embodiments may not be a fixed value, and may be set to a current having the same magnitude as that of the leakage current of the word line.

When the detection reference current is generated, the word line defect detection circuit 100 according to various example embodiments may apply the generated detection reference current to the selected word line (S920).

The current generating circuit 110 according to various example embodiments may generate the detection reference current having a magnitude such as a dynamically determined (or, alternatively, predetermined) magnitude, and may apply the generated detection reference current to the selected word line 200. For example, the current generating circuit 110 may select at least one word line, among word lines, and apply a current such as a dynamically determined (or, alternatively, preset) current to the selected word line 200 to determine a defect of the selected word line 200.

When the detection reference current is applied to the selected word line, the word line defect detection circuit 100 according to various example embodiments may measure a voltage of the selected word line generated based on the detection reference current (S930).

For example, the word line defect detection circuit 100 may select at least one word line, among the word lines, and apply the detection reference current to the selected word line. When the detection reference current is applied, the selected word line may have the voltage level $V_{wL}$ according to the application of the detection reference current. An initial voltage of the selected word line according to various example embodiments may be set to a ground (GND) voltage. For example, the voltage of the selected word line may be set to the ground (GND) level, and the voltage increased according to the application of the detection reference current may be measured as the voltage level $V_{wL}$ of the selected word line.

When the voltage of the selected word line is measured, the word line defect detection circuit 100 according to various example embodiments may determine whether the voltage of the selected word line has a value less than the reference voltage (S940).

For example, when is the processor 300 determines that the voltage level $V_{wL}$ of the selected word line has a value less than the reference voltage, the word line defect detection circuit 100 may determine that the selected word line is defective. The reference voltage according to various example embodiments may be a value set as a voltage that each of the word lines in the memory device 10 have when not defective. The reference voltage according to various example embodiments may be a value set based on characteristics of the selected word line. For example, the reference voltage may be set to a voltage level according to the detection reference current that may be derived based on resistance characteristics of the selected word line.

When the processor 300 determines that the voltage of the selected word line has a value less than the reference voltage, the word line defect detection circuit 100 according to various example embodiments may detect a defect in the selected word line (S950).

For example, the word line defect detection circuit 100 may detect whether a connection occurs in the selected word line 200, whether a short occurs in the selected word line 200, or whether the selected word line 200 is open.

However, if the processor 300 determines that the voltage of the selected word line does not have a value less than the reference voltage, the word line defect detection circuit 100 according to various example embodiments may determine that the selected word line is not defective (S960). When the voltage of the selected word line reaches the reference voltage, the word line defect detection circuit 100 according to various example embodiments may determine that the selected word line is not defective. For example, when the voltage of the selected word line reaches the reference voltage, the processor 300 may determine that the selected word line is not defective, and may perform a defect detection operation on word lines other than the selected word line. For example, when the processor 300 determines that the selected first word line is not defective, the word line defect detection circuit 100 may be configured to perform a selection operation on at least one word line, among the word lines, and apply the detection reference current to the selected second word line. Here, the first word line and the second word line are merely terms for distinguishing the selected word line from among the word lines.

Figure 10:
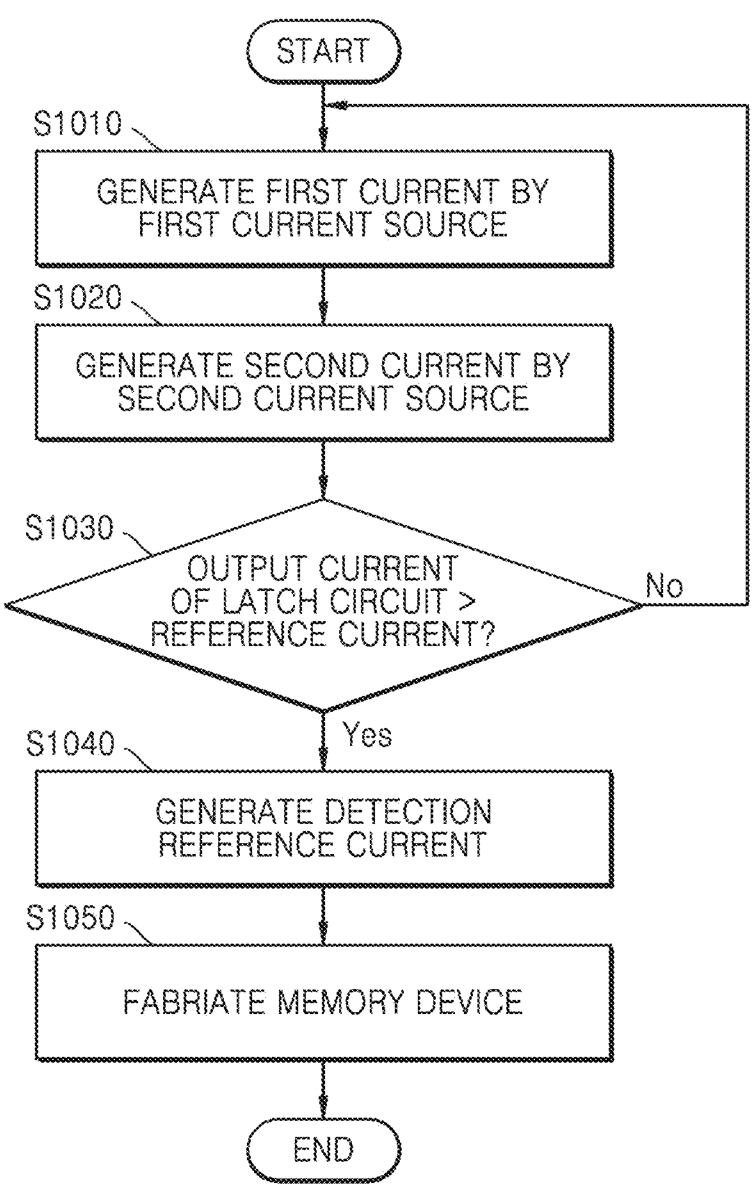
FIG. 10 is a flowchart illustrating a process of generating a detection reference current in a word line defect detection method according to various example embodiments.

FIG. 10 is a flowchart illustrating a process of generating a detection reference current in a word line defect detection method according to various example embodiments.

Referring to FIG. 10, the word line defect detection circuit 100 according to various example embodiments may generate a first current from the first current source 111 (S1010).

Also, the word line defect detection circuit 100 according to various example embodiments may generate a second current from the second current source 112 (S1020).

Each of the first current source 111 and the second current source 112 according to various example embodiments may be implemented as an active element or a passive element. The first current source 111 and the second current source 112 according to various example embodiments may form a latch structure. Also, currents respectively generated by the first current source 111 and the second current source 112 according to various example embodiments may be controlled by a first switch SW1 and a second switch SW2, respectively. The first current source 111 and the second current source 112 according to various example embodiments may form a latch structure with each other to adjust the amount of current to be applied to the selected word line 200. The current generating circuit 110 according to various example embodiments may be a high-precision current generating circuit having a size such as a dynamically determined (or, alternatively, preset) size. The latch structure including the first current source 111 and the second current source 112 according to various example embodiments may output current generated antagonistically by the first current source 111 and the second current source 112.

When the first current and the second current are generated, the word line defect detection circuit 100 according to various example embodiments may compare the magnitude of the output current of the latch circuit with the magnitude of a reference current (S1030).

The first comparator 113 according to various example embodiments may be configured to compare an output current from a latch circuit with a reference current $I_{REF}$ and generate a detection reference current based on a comparison result. For example, the first comparator according to various example embodiments may receive the output current from the latch circuit and the reference current $I_{REF}$ as inputs, and compare the output current from the latch circuit with the reference current $I_{REF}$.

When the processor 300 determines that the magnitude of the output current of the latch circuit is greater than the magnitude of the reference current, the word line defect detection circuit 100 according to various example embodiments may generate a detection reference current (S1040).

When the output current from the latch circuit exceeds the reference current $I_{REF}$ as a result of the comparison, the first comparator 113 may set the output current from the latch circuit to an output of the current generating circuit 110. For example, when the output current from the latch circuit exceeds the reference current $I_{REF}$, the current generating circuit 110 according to various example embodiments may output the output current from the latch circuit, as the detection reference current.

However, when the processor 300 determines that the magnitude of the output current of the latch circuit is not greater than the magnitude of the reference current, the word line defect detection circuit 100 according to various example embodiments may generate the first current and the second current again.

Additionally in some example embodiments, the memory device may be fabricated based on the generation of the detection reference current (S1050).

Figure 11:
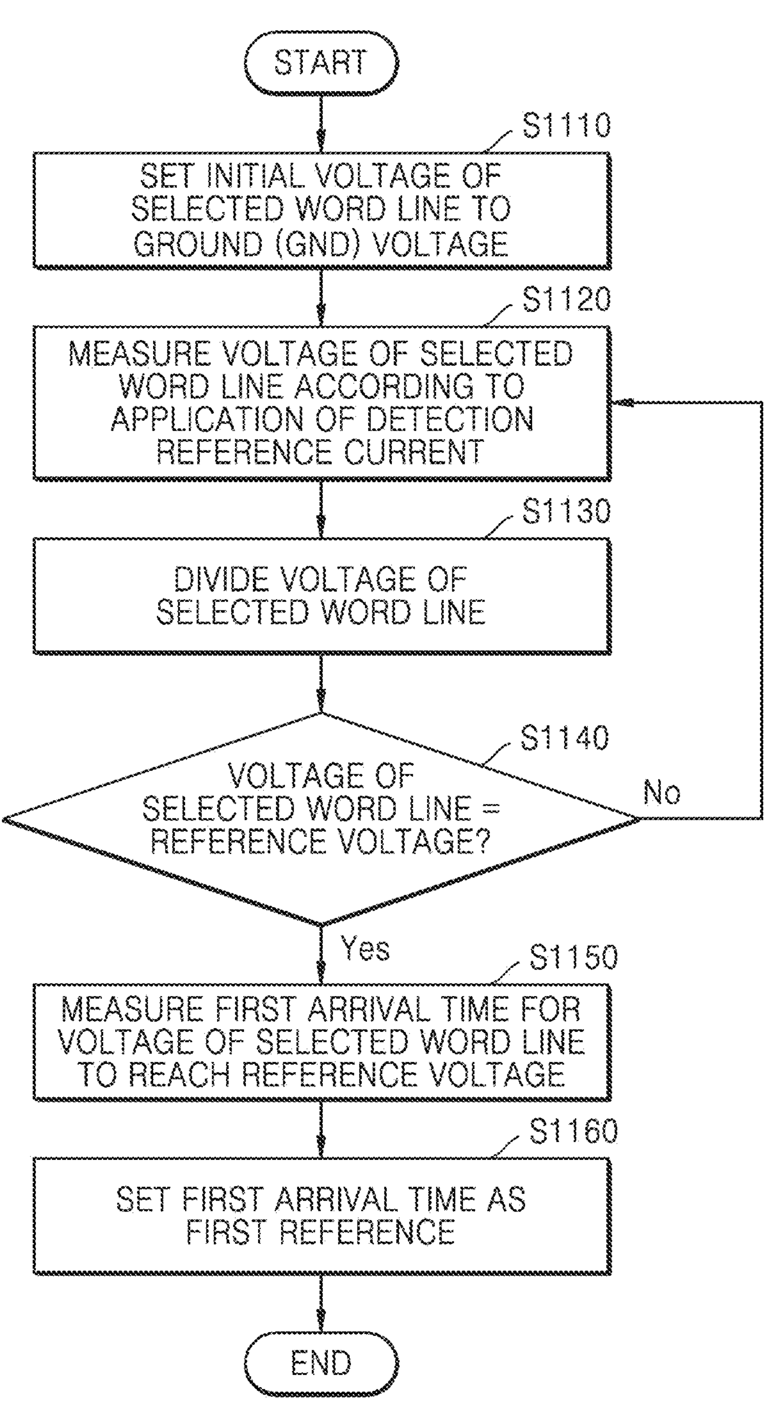
FIG. 11 is a flowchart illustrating a process of setting a reference for determining a defect of a word in a word line defect detection method according to various example embodiments.

FIG. 11 is a flowchart illustrating a process of setting a reference for determining a defect of a word line in a word line defect detection method according to various example embodiments.

Referring to FIG. 11, the word line defect detection circuit 100 according to various example embodiments may set an initial voltage of the selected word line to the ground GND voltage (S1110).

The word line defect detection circuit 100 according to various example embodiments may discharge a voltage of the selected word line to the ground GND level in the word line setup period WL Setup. Also, the word line defect detection circuit 100 according to various example embodiments may not apply the detection reference current in the word line setup period (WL Setup).

When the initial voltage of the selected word line is set, the word line defect detection circuit 100 according to various example embodiments may measure the voltage of the selected word line according to the application of the detection reference current (S1120).

The word line defect detection circuit 100 according to various example embodiments may apply the detection reference current to the selected word line in the detection reference current application period Develop. When the detection reference current is applied, the voltage of the selected word line may start to increase. The word line defect detection circuit 200 according to various example embodiments may measure the time tDEV for the voltage of the selected word line to reach the reference voltage VREF1. For example, the word line defect detection circuit 100 may include a counter and may measure a time for the voltage of the selected word line to reach the reference voltage VREF1 by generating clock signals at regular intervals.

When the voltage of the selected word line according to the application of the detection reference current is measured, the word line defect detection circuit according to various example embodiments may divide the voltage of the selected word line (S1130).

The word line defect detection circuit 100 according to various example embodiments may include the first capacitor C1 and the second capacitor C2, and may be configured to divide the voltage of the selected word line by using the first capacitor C1 and the second capacitor C2. The word line defect detection circuit 100 according to various example embodiments may transmit the voltage of the selected word line from the first capacitor C1 and the second capacitor C2.

When the voltage of the selected word line is divided, the word line defect detection circuit 100 according to various example embodiments may compare the voltage of the selected word line with the reference voltage (S1140).

The word line defect detection circuit 100 according to various example embodiments may compare the voltage $V_{wL}$ of the selected word line with the reference voltage VREF1. As a result of the comparison, the word line defect detection circuit 100 may output a greater value among the voltage $V_{wL}$ of the selected word line and the reference voltage VREF1. The sensing amplifier 120 according to various example embodiments may determine whether the selected word line 200 is defective based on an output voltage PF.

When the processor 300 determines that the voltage of the selected word line is equal to the reference voltage, the word line defect detection circuit 100 according to various example embodiments may measure the first arrival time for the voltage of the selected word line to reach the reference voltage (S1150).

The word line defect detection circuit 100 according to various example embodiments may determine, as the first arrival time, the time for which the voltage of the selected word line 200 according to the application of the detection reference current reaches the reference voltage.

According to various example embodiments, the word line defect detection circuit 100 may receive the output voltage PF, and when the processor 300 determines that the voltage $V_{wL}$ of the selected word line has a value greater than the reference voltage VREF1 before the first arrival time, the word line defect detection circuit 100 may determine that the selected word line 200 is not defective. However, when the processor 300 determines that the voltage of the selected word line has a value greater than the reference voltage VREF1 after the first arrival time, the word line defect detection circuit 100 according to various example embodiments may determine that the selected word line 200 is defective.

However, when the processor 300 determines that the voltage of the selected word line is not equal to the magnitude of the reference voltage, the word line defect detection circuit 100 according to various example embodiments may allow the voltage of the selected word line according to the application of the detection reference current to be continuously measured.

When the first arrival time is measured, the word line defect detection circuit 100 according to various example embodiments may set the first arrival time as the first reference (S1160). The first reference according to various example embodiments may be a reference for determining whether other word lines are defective when no defect exists in the selected word line.

Figure 12:
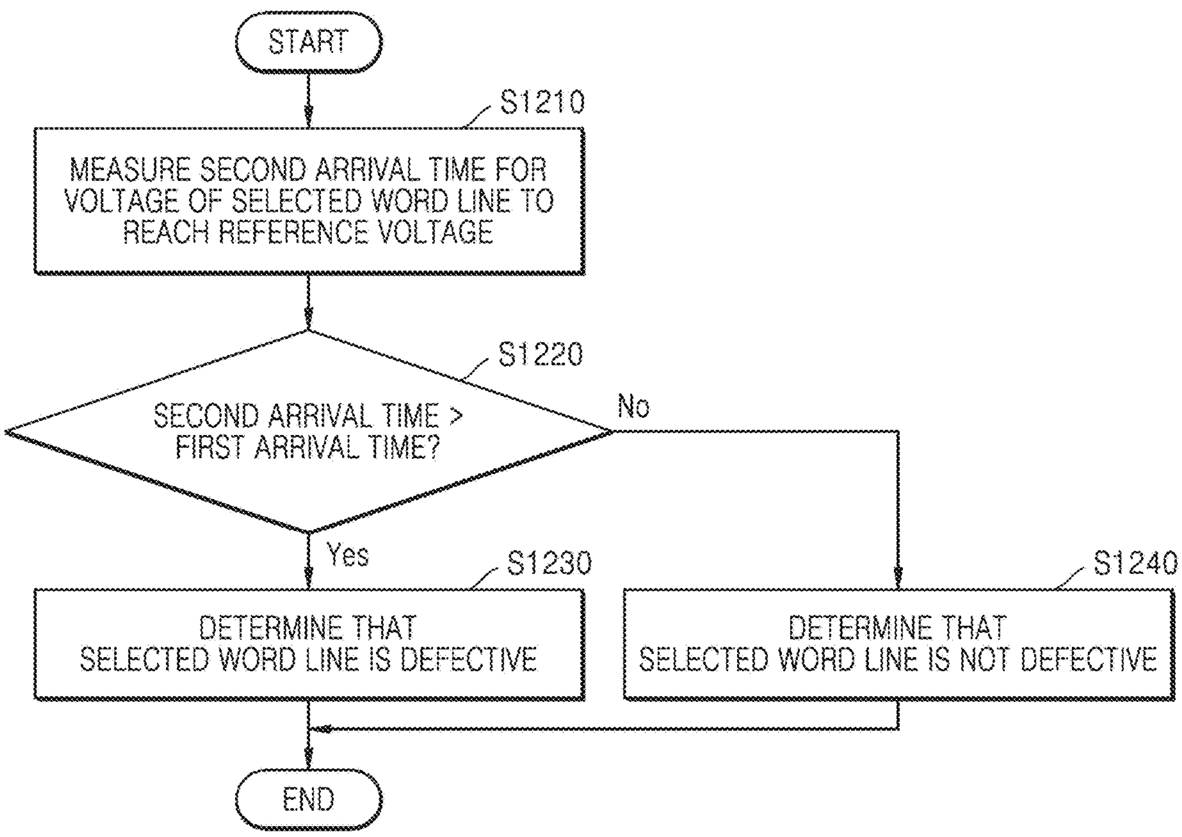
FIG. 12 is a flowchart illustrating a process of detecting a defect existing in a word line in a word line defect detection method according to various example embodiments.

FIG. 12 is a flowchart illustrating a process of detecting a defect existing in a word line in a word line defect detection method according to various example embodiments.

Referring to FIG. 12, the word line defect detection circuit 100 according to various example embodiments may measure the second arrival time for the voltage of the selected word line to reach the reference voltage (S1210).

According to various example embodiments, the second arrival time may be a time for the voltage of the selected word line 200 to reach the reference voltage, when the detection reference current is applied to the selected word line 200 having a defect.

When the second arrival time is measured, the word line defect detection circuit 100 according to various example embodiments may compare the first arrival time with the second arrival time (S1220). According to various example embodiments, the first arrival time may be determined as the first reference, and the first reference may be compared with the second arrival time.

When the processor 300 determines that the second arrival time is greater than the first arrival time as a result of the comparison, the word line defect detection circuit 100 according to various example embodiments may determine that the selected word line is defective (S1230).

For example, when the processor 300 determines that the second arrival time is greater than the first reference, the word line defect detection circuit 100 may determine that the selected word line is defective. When the processor 300 determines that the second arrival time taken for the voltage level of the selected word line to reach the reference voltage according to various example embodiments exceeds the first arrival time, the word line defect detection circuit 100 according to various example embodiments may determine that the selected word line is defective. For example, when the processor 300 determines that the second arrival time taken for the voltage level of the selected word line 200 to reach the reference voltage exceeds the first reference, the word line defect detection circuit 100 according to various example embodiments may determine that the selected word line 200 is defective.

However, when it is determined that the second arrival time is not greater than the first arrival time, the word line defect detection circuit 100 according to various example embodiments may determine that the selected word line is not defective (S1240).

Figure 13:
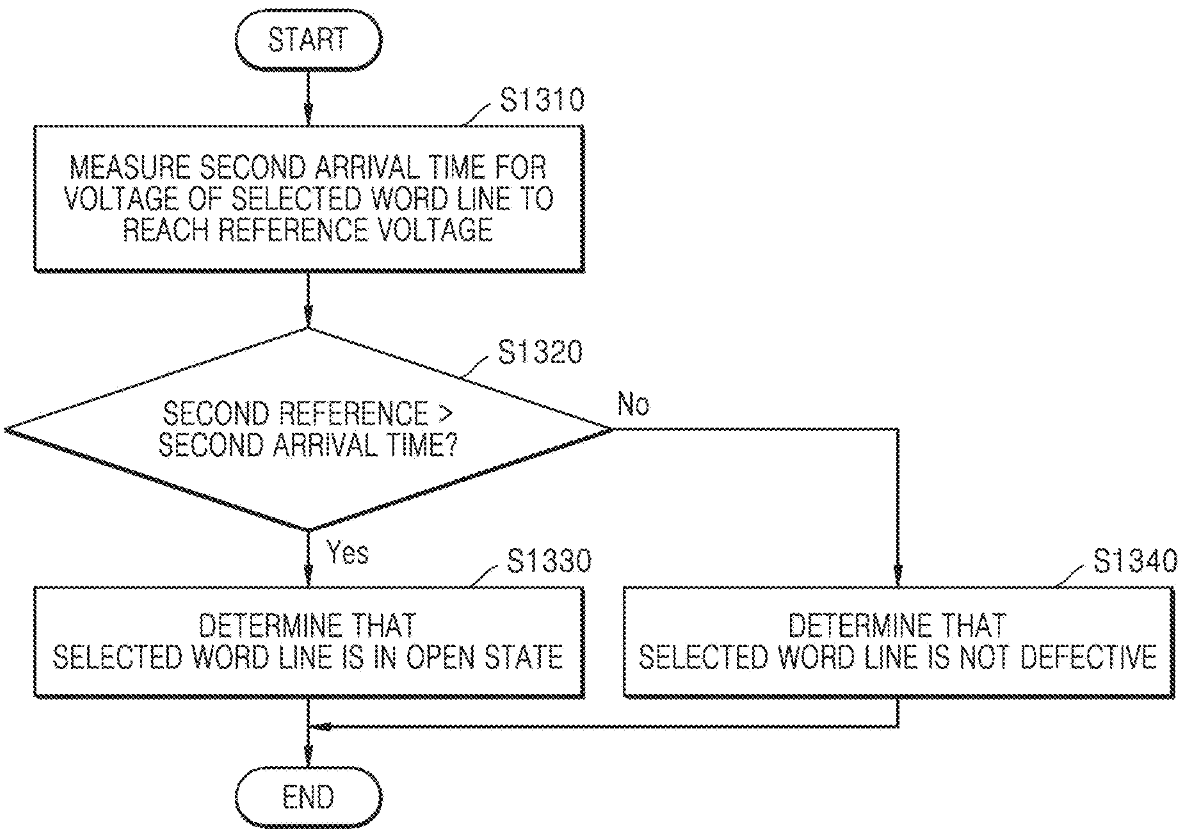
FIG. 13 is a flowchart illustrating a process of detecting an open word line in a word line defect detection method according to various example embodiments.

FIG. 13 is a flowchart illustrating a process of detecting an open word line in a word line defect detection method according to various example embodiments.

Referring to FIG. 13, the word line defect detection circuit 100 according to various example embodiments may measure the second arrival time for the voltage of the selected word line to reach the reference voltage (S1310).

According to various example embodiments, the second arrival time may be a time for the voltage of the selected word line 200 to reach the reference voltage when the detection reference current is applied to the selected word line 200 having a defect.

When the second arrival time is measured, the word line defect detection circuit 100 according to various example embodiments may compare the second reference with the second arrival time (S1320).

When the processor 300 determines that the second reference is greater than the second arrival time as a result of the comparison, the word line defect detection circuit 100 according to various example embodiments may determine that the selected word line is in an open state (S1330).

When the processor 300 determines that the second reference according to various example embodiments exceeds the second arrival time, the processor 300 may determine that the selected word line is in an open state. The second reference according to various example embodiments may be or may be based on a minimum time for a word line determined not to be defective to reach the reference voltage as a result of applying the detection reference current to at least one of the word lines. For example, when the processor 300 determines that the time for the voltage level of the selected word line as a result of applying the detection reference current to the selected word line 200 is less than the minimum time for another word line determined not to be defective to reach the reference voltage, the processor 300 may determine that the selected word line 200 is in an open state.

However, when the processor 300 determines that the second reference is not greater than the second arrival time, the word line defect detection circuit 100 according to various example embodiments may determine that the selected word line is not defective (S1340). For example, when the processor 300 determines that the second reference is less than the second arrival time, the processor 300 may determine that the selected word line is not in an open state.

Figure 14:
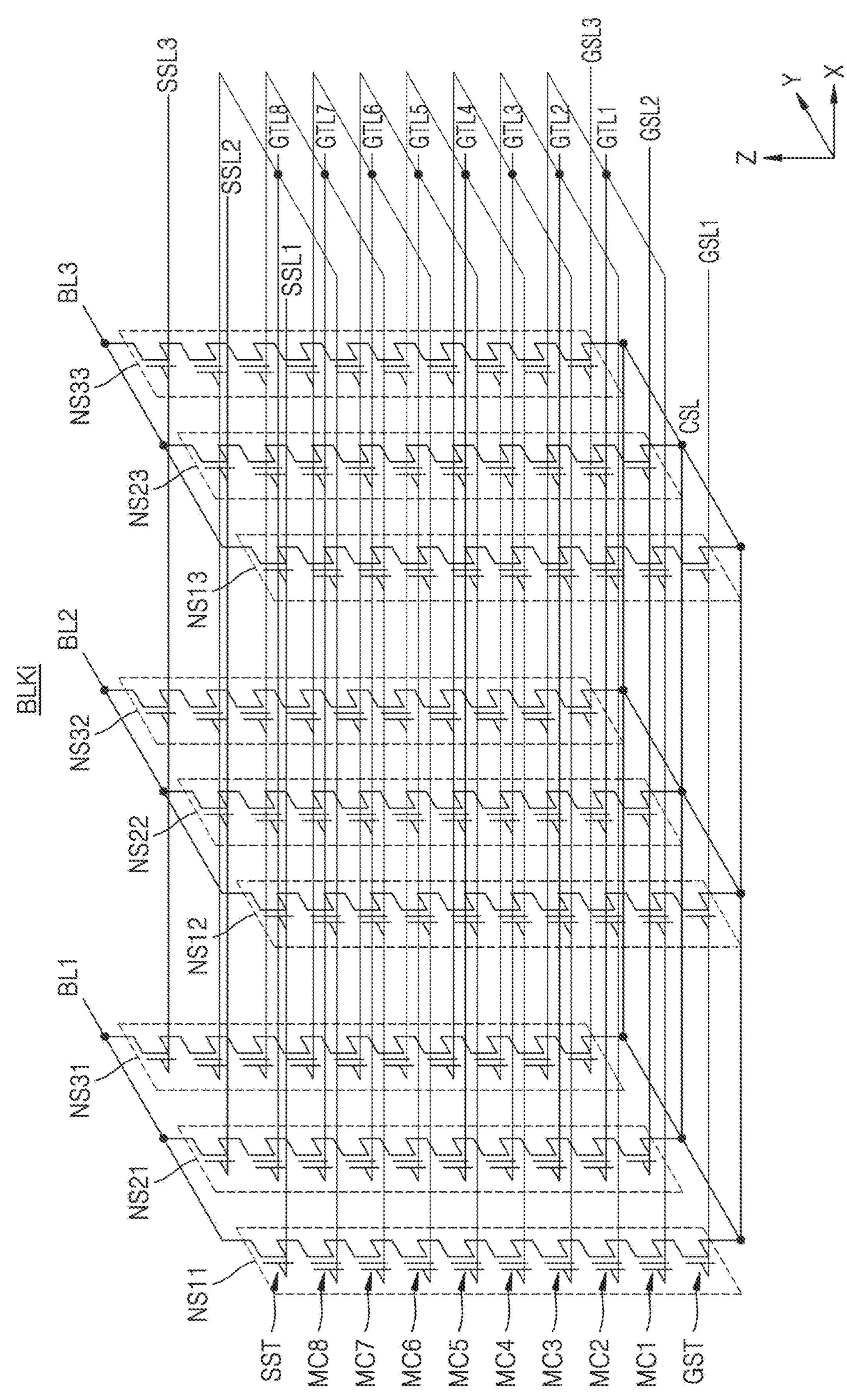
FIGS. 14 and 15 are circuit diagrams of a memory device according to various example embodiments.
Figure 15:
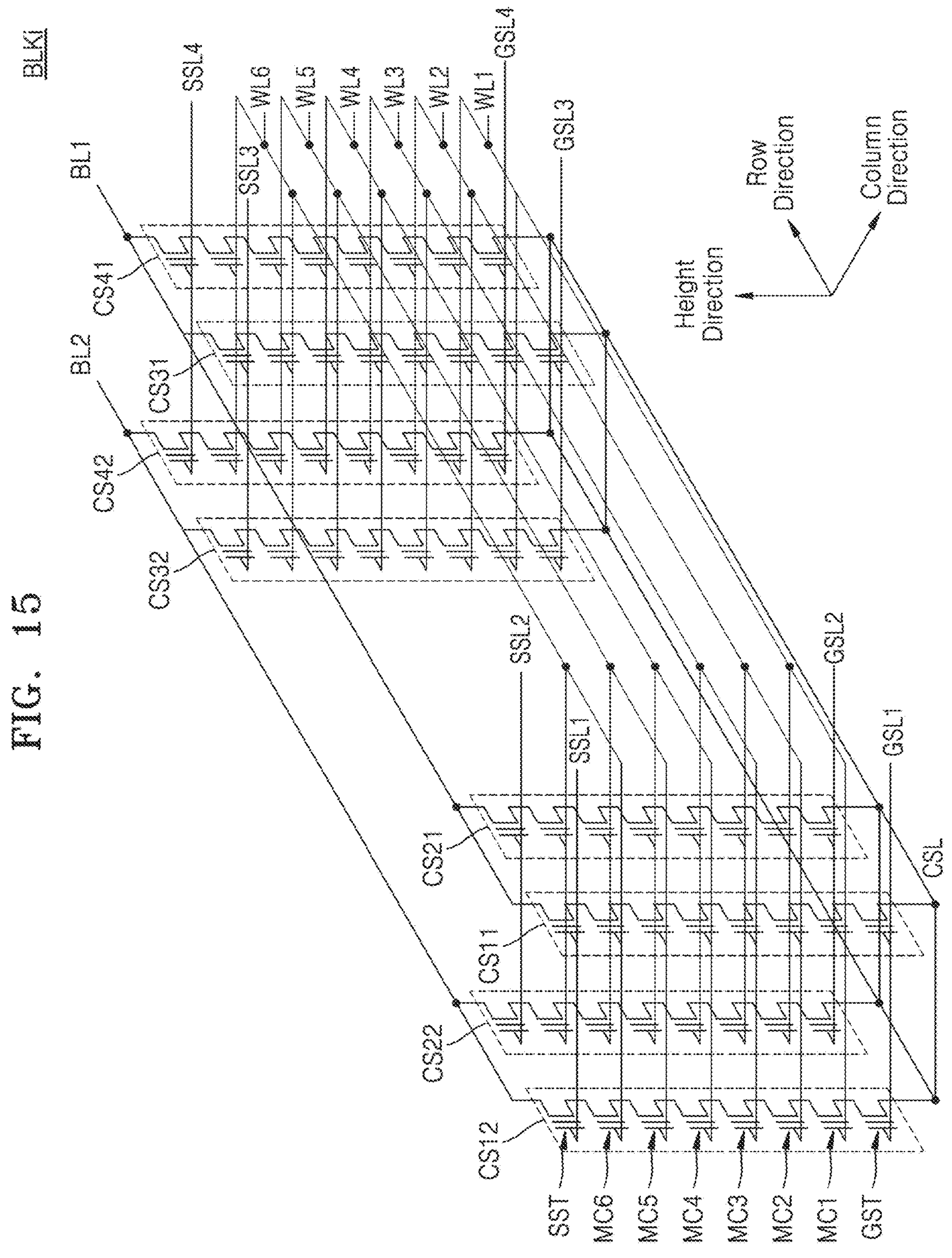

FIGS. 14 and 15 illustrate a memory block BLKi of a memory device according to various example embodiments.

Referring to FIG. 14, the memory block BLKi may include a plurality of memory NAND strings NS11 to NS33 connected between bit lines BL1, BL2, and BL3 and common source line CSL. Each of the memory NAND strings NS11 to NS33 may include a string select transistor SST, a plurality of memory cells MC1 to MC8, and a ground select transistor GST. For brevity of the drawing, FIG. 10 shows that each of the plurality of memory NAND strings NS11 to NS33 includes eight memory cells MC1 to MC8, but is not necessarily limited thereto.

The string select transistor SST may be connected to corresponding string select lines SSL1, SSL2, and SSL3. The memory cells MC1 to MC8 may be connected to corresponding gate lines GTL1 to GTL8, respectively. The gate lines GTL1 to GTL8 may correspond to word lines, and some of the gate lines GTL1 to GTL8 may correspond to dummy word lines. The ground select transistor GST may be connected to corresponding ground select lines GSL1, GSL2, and GSL3. The string select transistor SST may be connected to corresponding bit lines BL1, BL2, and BL3, and the ground select transistor GST may be connected to the common source line CSL.

Gate lines (e.g., GTL1) having the same height may be commonly connected, and the ground select lines GSL1, GSL2, and GSL3 may be separated from the string select lines SSL1, SSL2, and SSL3. FIG. 14 illustrates that the memory block BLK is connected to eight gate lines GTL1 to GTL8 and three bit lines BL1, BL2, and BL3, but is not limited thereto.

Referring to FIG. 15, the memory block BLKi includes a plurality of cell strings CS11 to CS41 and CS12 to CS42. The cell strings CS11 to CS41 and CS12 to CS42 may be arranged in row and column directions to form rows and columns.

Each cell string includes the ground select transistor GST, the memory cells MC1 to MC6, and the string select transistor SST. The ground select transistor GST, the memory cells MC1 to MC6, and the string select transistor SST of each cell string may be stacked in a height direction perpendicular to a substrate.

Rows of the plurality of cell strings CS11 to CS41 and CS12 to CS42 are respectively connected to different string select lines SSL1 to SSL4. For example, the string select transistors SST of the cell strings CS11 and CS12 are commonly connected to the string select line SSL1. The string select transistors SST of the cell strings CS21 and CS22 are commonly connected to the string select line SSL2. The string select transistors SST of the cell strings CS31 and CS32 are commonly connected to the string select line SSL3. The string select transistors SST of the cell strings CS41 and CS42 are commonly connected to the string select line SSL4.

Columns of the cell strings CS11 to CS41 and CS12 to CS42 are respectively connected to different bit lines BL1 and BL2. For example, the string select transistors SST of the cell strings CS11 to CS41 are commonly connected to the bit line BL1. The string select transistors SST of the cell strings CS12 to CS42 are commonly connected to the bit line BL2.

Rows of the plurality of cell strings CS11 to CS41 and CS12 to CS42 are respectively connected to different ground select lines GSL1 to GSL4. For example, the ground select transistors GST of the cell strings CS11 and CS12 are commonly connected to the ground select line GSL1. The ground select transistors GST of the cell strings CS21 and CS22 are commonly connected to the ground select line GSL2. The ground select transistors GST of the cell strings CS31 and CS32 are commonly connected to the ground select line GSL3. The ground select transistors GST of the cell strings CS41 and CS42 are commonly connected to the ground select line GSL4.

Memory cells located at the same height from the substrate (or the ground select transistors GST) may be commonly connected to one word line, and memory cells located at different heights may be connected to different word lines WL1 to WL6, respectively. For example, the memory cells MC1 are commonly connected to the word line WL1. The memory cells MC2 are commonly connected to the word line WL2. The memory cells MC3 are commonly connected to the word line WL3. The memory cells MC4 are commonly connected to the word line WL4. The memory cells MC5 are commonly connected to the word line WL5. The memory cells MC6 are commonly connected to the word line WL6.

The ground select transistors GST of the cell strings CS11 to CS41 and CS12 to CS42 are commonly connected to the common source line CSL.

The memory block BLKi shown in FIG. 2 is an example. The inventive concept is not limited to the memory block BLKi shown in FIG. 2. For example, the number of rows of cell strings may increase or decrease. As the number of rows of cell strings changes, the number of string select lines connected to the rows of cell strings and the number of cell strings connected to one bit line may also change. As the number of rows of cell strings changes, the number of ground select lines connected to the rows of cell strings may also change.

The number of columns of cell strings may increase or decrease. As the number of columns of cell strings changes, the number of bit lines connected to columns of cell strings and the number of cell strings connected to one string select line may also change.

The height of the cell strings may increase or decrease. For example, the number of memory cells stacked in each of the cell strings may increase or decrease. As the number of memory cells stacked on each of the cell strings changes, the number of word lines may also change. For example, the number of string select transistors or ground select transistors provided in each of the cell strings may increase. As the number of string select transistors or ground select transistors provided in each of the cell strings changes, the number of string select lines or ground select lines may also change. When the number of string select transistors or ground select transistors increases, the string select transistors or ground select transistors may be stacked in the same form as that of the memory cells MC1 to MC6.

For example, writing and reading may be performed in units of rows of the cell strings CS11 to CS41 and CS12 to CS42. The cell strings CS11 to CS41 and CS12 to CS42 may be selected in units of one row by the ground select lines GSL1 to GSL4, and the cell strings CS11 to CS41 and CS12 to CS42 may be selected in units of one row by the string select lines SSL1 to SSL4. In addition, a voltage may be applied to the ground select lines GSL1 to GSL4 as a unit of at least two ground select lines GSL1 and GSL2 or GSL3 and GSL4. A voltage may be applied to the ground select lines GSL1 to GSL4 as a unit. The ground select lines GSL1 to GSL4 according to various example embodiments may be programmed to have a threshold voltage such as a dynamically determined (or, alternatively, predetermined) threshold voltage.

In the selected rows of the cell strings CS11 to CS41 and CS12 to CS42, writing and reading may be performed in units of pages. A page may be one row of memory cells connected to one word line. In the selected rows of the cell strings CS11 to CS41 and CS12 to CS42, memory cells may be selected in units of pages by the word lines WL1 to WL6.

Figure 16:
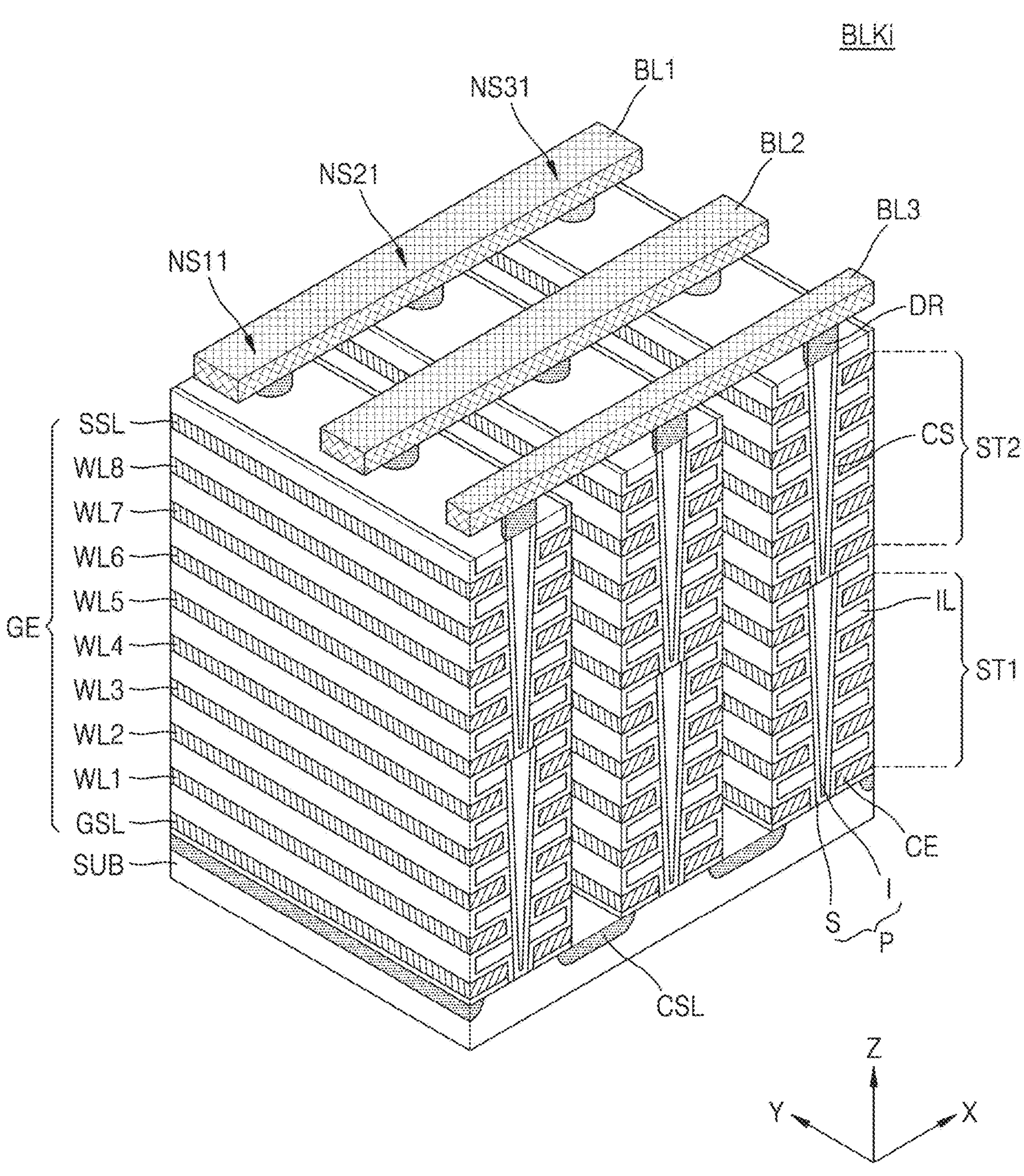
FIGS. 16 and 17 illustrate a memory device implemented in a stacked structure according to various example embodiments.
Figure 17:
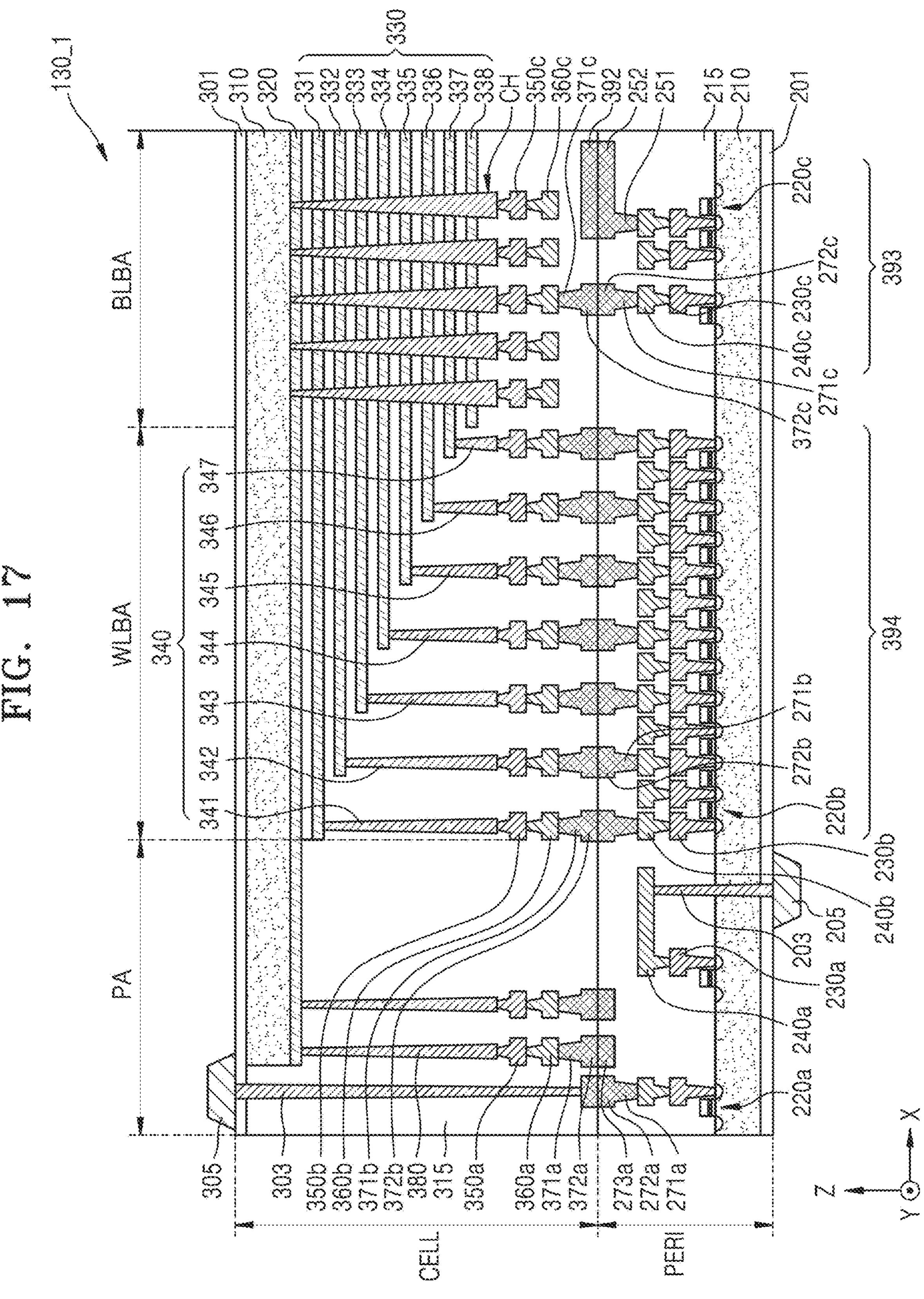

FIGS. 16 and 17 are diagrams illustrating a 3D V-NAND structure applicable to the memory device 10 according to various example embodiments.

A first nonvolatile memory 130_1 applicable to the memory device 10 (FIG. 1) may include a plurality of memory blocks.

Referring to FIG. 16, the memory block BLKi is formed or arranged vertically with respect to the substrate SUB. Memory cells constituting the memory NAND strings NS11 to NS33 are formed by stacking a plurality of semiconductor layers.

The common source line CSL extending in a first direction (a Y direction) is provided on the substrate SUB. In a region of the substrate SUB between two adjacent common source lines CSL, a plurality of insulating films IL extending in the first direction (the Y direction) are sequentially provided in a third direction (a Z direction), and the plurality of insulating layers IL may be apart from each other by a certain distance in the third direction (the Z direction). In a region of the substrate SUB between two adjacent common source lines CSL, a plurality of pillars P are sequentially arranged in the first direction (the Y direction) and pass through the insulating films IL in the third direction (the Z direction). The pillars P may pass through the insulating layers IL to contact the substrate SUB. A surface layer S of each pillar P may include a silicon material doped with a first conductivity type, and may function as a channel region.

An internal layer I of each pillar P may include an insulating material, such as silicon oxide and/or an air gap. In a region between two adjacent common source lines CSL, a charge storage layer CS is provided along exposed surfaces of the substrate SUB, the pillars P, and the insulating films IL. The charge storage layer CS may include a gate insulating layer (or referred to as a 'tunneling insulating layer'), a charge trap layer, and a blocking insulating layer. In addition, in a region between two adjacent common source lines CSL, gate electrodes GE, such as the select lines GSL and SSL and the word lines WL1 to WL8, are provided on an exposed surface of the charge storage layer. Drains or drain contacts DR may be provided on the pillars P, respectively. On the drain contact DR, bit lines BL1 to BL3 may extend in the second direction (the X direction) and be apart from each other by a certain distance in the first direction (the Y direction).

As shown in FIG. 16, each of the memory NAND strings NS11 to NS33 may be implemented in a structure in which a first memory stack ST1 and a second memory stack ST2 are stacked. The first memory stack ST1 is connected to the common source line CSL, the second memory stack ST2 is connected to the bit lines BL1 to BL3, and the first memory stack ST1 and the second memory stack (ST2) are stacked to share channel holes with each other.

Referring further to FIG. 17, the nonvolatile memory 110 may have a chip-to-chip (C2C) structure. The C2C structure may refer to a structure formed by manufacturing an upper chip including a cell region CELL on a first wafer, manufacturing a lower chip including a peripheral circuit region PERI on a second wafer, different from the first wafer, and then connecting the upper chip to the lower chip by a bonding method. For example, the bonding method may refer to a method of electrically connecting a bonding metal formed on the uppermost metal layer of the upper chip to a bonding metal formed on the uppermost metal layer of the lower chip. For example, when the bonding metal includes copper (Cu), the bonding method may be a Cu—Cu bonding method, and the bonding metal may also include aluminum (Al) or tungsten (W).

Each of the peripheral circuit region PERI and the cell region CELL of the nonvolatile memory 110 may include an external pad bonding region PA, a word line bonding region WLBA, and a bit line bonding region BLBA.

The peripheral circuit region PERI may include a first substrate 210, an interlayer insulating layer 215, a plurality of circuit elements 220*a*, 220*b*, and 220*c* formed on the first substrate 210, first metal layers 230*a*, 230*b*, and 230*c* respectively connected to the circuit elements 220*a*, 220*b*, and 220*c*, and second metal layers 240*a*, 240*b*, and 240*c* formed on the first metal layers 230*a*, 230*b*, and 230*c*. In various example embodiments, the first metal layers 230*a*, 230*b*, and 230*c* may include tungsten having a relatively high electrical resistivity, and the second metal layers 240*a*, 240*b*, and 240*c* may include copper having a relatively low electrical resistivity.

As used herein, only the first metal layers 230*a*, 230*b*, and 230*c* and the second metal layers 240*a*, 240*b*, and 240*c* are illustrated and described, but the inventive concept is not limited thereto, and at least one metal layer may be further formed on the second metal layers 240*a*, 240*b*, and 240*c*. At least some of the at least one metal layer formed on the second metal layers 240*a*, 240*b*, and 240*c* may include aluminum having electrical resistivity lower than that of copper forming the second metal layers 240*a*, 240*b*, and 240*c*.

The interlayer insulating layer 215 are formed on the first substrate 210 to cover the circuit elements 220*a*, 220*b*, and 220*c*, the first metal layers 230*a*, 230*b*, and 230*c*, and the second metal layers 240*a*, 240*b*, and 240*c*, and may include an insulating material, such as silicon oxide or silicon nitride.

Lower bonding metals 271*b* and 272*b* may be formed on the second metal layer 240*b* of the word line bonding region WLBA. In the word line bonding region WLBA, the lower bonding metals 271*b* and 272*b* of the peripheral circuit region PERI may be electrically connected to the upper bonding metals 371*b* and 372*b* of the cell region CELL by a bonding method, and the lower bonding metals 271*b* and 272*b* and the upper bonding metals 371*b* and 372*b* may include aluminum, copper, or tungsten.

The cell region CELL may provide at least one memory block. The cell region CELL may include the second substrate 310 and a common source line 320. A plurality of word lines 331 to 338 (330) may be stacked on the second substrate 310 in a direction (the Z direction) perpendicular to an upper surface of the second substrate 310. String select lines and a ground select line may be located above and below the word lines 330, and a plurality of word lines 330 may be arranged between the string select lines and the ground select line.

In the bit line bonding region BLBA, a channel structure CH may extend in a direction (the Z direction) perpendicular to the upper surface of the second substrate 310 and pass through the word lines 330, string select lines, and ground select line. The channel structure CH may include a data storage layer, a channel layer, and a buried insulating layer, and the channel layer may be electrically connected to a first metal layer 350*c* and a second metal layer 360*c*. For example, the first metal layer 350*c* may be a bit line contact, and the second metal layer 360*c* may be a bit line. In various example embodiments, the bit line 360*c* may extend in the first direction (the Y direction) parallel to the upper surface of the second substrate 310.

A region in which the channel structure CH and the bit line 360*c* are located may be defined as the bit line bonding region BLBA. In the bit line bonding region BLBA, the bit line 360*c* may be electrically connected to the circuit elements 220*c* providing a page buffer 393 in the peripheral circuit region PERI. For example, in the peripheral circuit region PERI, the bit line 360*c* may be connected to upper bonding metals 371*c* and 372*c*, and the upper bonding metals 371*c* and 372*c* may be connected to the lower bonding metals 271*c* and 272*c* connected to the circuit elements 220*c* of the page buffer 393.

In the word line bonding region WLBA, the word lines 330 may extend in the second direction (the X direction) perpendicular to the first direction and parallel to the upper surface of the second substrate 310, and may be connected to cell contact plugs 341 to 347 (340). The word lines 330 may be connected to the cell contact plugs 340 in pads provided as some of the word lines 330 extend to have different lengths in the second direction. A first metal layer 350*b* and a second metal layer 360*b* may be sequentially connected to upper portions of the cell contact plugs 340 connected to the word lines 330. In the word line bonding region WLBA, the cell contact plugs 340 may be connected to the peripheral circuit region PERI through the upper bonding metals 371*b* and 372*b* of the cell region CELL and the lower bonding metals 271*b* and 272*b* of the peripheral circuit region PERI.

In the peripheral circuit region PERI, the cell contact plugs 340 may be electrically connected to the circuit elements 220*b* providing a row decoder 394. In various example embodiments, an operating voltage of the circuit elements 220*b* forming the row decoder 394 may be different from an operating voltage of the circuit elements 220*c* forming the page buffer 393. For example, the operating voltage of the circuit elements 220*c* forming the page buffer 393 may be higher than the operating voltage of the circuit elements 220*b* forming the row decoder 394.

A common source line contact plug 380 may be located in the external pad bonding region PA. The common source line contact plug 380 may include a conductive material, such as metal, a metal compound, or polysilicon, and may be electrically connected to the common source line 320. A first metal layer 350*a* and a second metal layer 360*a* may be sequentially stacked on the common source line contact plug 380. For example, a region in which the common source line contact plug 380, the first metal layer 350*a*, and the second metal layer 360*a* are located may be defined as the external pad bonding region PA.

Meanwhile, first and second input/output (I/O) pads 205 and 305 may be located in the external pad bonding region PA. A lower insulating film 201 covering a lower surface of the first substrate 210 may be formed below the first substrate 210, and the first I/O pad 205 may be formed on the lower insulating film 201*a*. The first I/O pad 205 may be connected to at least one of the circuit elements 220*a*, 220*b*, and 220*c* arranged in the peripheral circuit region PERI through a first I/O contact plug 203, and may be separated from the first substrate 210 by the lower insulating film 201*a*. In addition, a side insulating film may be disposed between the first I/O contact plug 203 and the first substrate 210 to electrically separate the first I/O contact plug 203 from the first substrate 210.

An upper insulating film 301 covering the upper surface of the second substrate 310 may be formed on the second substrate 310, and the second I/O pads 305 may be disposed on the upper insulating film 301. The second I/O pad 305 may be connected to at least one of the circuit elements 220*a*, 220*b*, and 220*c* located in the peripheral circuit region PERI through the second I/O contact plug 303. In various example embodiments, the second I/O pad 305 may be electrically connected to the circuit element 220*a*.

According to various example embodiments, the second substrate 310 and the common source line 320 may not be located in a region in which the second I/O contact plug 303 is located. In addition, the second I/O pad 305 may not overlap the word lines 330 in the third direction (the Z direction). The second I/O contact plug 303 may be separated from the second substrate 310 in a direction parallel to the upper surface of the second substrate 310, and maybe connected to the second I/O pad 305 through the interlayer insulating layer 315 of the cell region CELL.

According to various example embodiments, the first I/O pad 205 and the second I/O pad 305 may be selectively formed. For example, the nonvolatile memory 110 may include only the first I/O pad 205 disposed on the first substrate 210 or only the second I/O pad 305 disposed on the second substrate 310. Alternatively, the nonvolatile memory 110 may include both the first I/O pad 205 and the second I/O pad 305.

In each of the external pad bonding region PA and the bit line bonding region BLBA included in the cell region CELL and the peripheral circuit region PERI, a metal pattern of the uppermost metal layer may exist as a dummy pattern, or the uppermost metal layer may be empty.

In the nonvolatile memory 110, in the external pad bonding region PA, a lower metal pattern 273*a* having the same shape as that of the upper metal pattern 372*a* of the cell region CELL may be formed on the uppermost metal layer of the peripheral circuit region PERI, to correspond to the upper metal pattern 372*a* formed on the uppermost metal layer of the cell region CELL. The lower metal pattern 273*a* formed on the uppermost metal layer of the peripheral circuit region PERI may not be connected to a separate contact in the peripheral circuit region PERI. Similarly, in the external pad bonding region PA, an upper metal pattern 373*a* having the same shape as that of the lower metal pattern 273*a* of the peripheral circuit region PERI may be formed on the upper metal layer of the cell region CELL, to correspond to the lower metal pattern 273*a* formed on the uppermost metal layer of the peripheral circuit region PERI.

Lower bonding metals 271*b* and 272*b* may be formed on the second metal layer 240*b* of the word line bonding region WLBA. In the word line bonding region WLBA, the lower bonding metals 271*b* and 272*b* of the peripheral circuit region PERI may be electrically connected to the upper bonding metals 371*b* and 372*b* of the cell region CELL, respectively, by a bonding method.

In addition, in the bit line bonding region BLBA, an upper metal pattern 392 having the same shape as that of the lower metal pattern 252 of the peripheral circuit region PERI may be formed on the uppermost metal layer of the cell region CELL, to correspond to the lower metal pattern 252 formed on the uppermost metal layer of the peripheral circuit region PERI. A contact may not be formed on the upper metal pattern 392 formed on the uppermost metal layer of the cell region CELL.

Any of the elements and/or functional blocks disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc. The processing circuitry may include electrical components such as at least one of transistors, resistors, capacitors, etc. The processing circuitry may include electrical components such as logic gates including at least one of AND gates, OR gates, NAND gates, NOT gates, etc.

While various example embodiments have been particularly shown and described with reference to embodiments thereof, it will be understood that various changes in form and details may be made therein without departing from the spirit and scope of the following claims. Additionally, example embodiments are not necessarily mutually exclusive with one another. For example, some example embodiments may include one or more features described with reference to one or more figures, and may also include one or more other features described with reference to one or more other figures.

What is claimed is:

1. A word line defect detection circuit configured to detect a defect of at least one word line, which is a selected first word line that is selected from a plurality of word lines of a memory device, the word line defect detection circuit comprising:

a current generating circuit configured to discharge the selected first word line to a ground (GND) voltage, to generate a detection reference current having a first magnitude, and to apply the detection reference current to the selected first word line in response to the selected word line being discharged to the ground (GND) voltage; and a sensing amplifier configured to measure a measured voltage of the selected first word line, the measured voltage generated based on the detection reference current, wherein in response to determining that the measured voltage according to application of the detection reference current to the selected first word line has a value less than a first reference voltage, the word line defect detection circuit is configured to detect a defect existing in the selected first word line, and in response to the measured voltage of the selected first word line being equal to the first reference voltage, the word line defect detection circuit is configured to determine that the selected first word line is not defective.

2. The word line defect detection circuit of claim 1, wherein the current generating circuit includes:

a first current source;

a second current source configured to form a latch circuit with the first current source; and a first comparator configured to compare an output current from the latch circuit with a second reference current, and to generate, based on a comparison result, the detection reference current.

3. The word line defect detection circuit of claim 1, wherein the sensing amplifier includes:

a first capacitor;

a second capacitor connected to the first capacitor and configured to divide the measured voltage of the selected first word line into a divided voltage; and a second comparator configured to compare the divided voltage of the selected first word line with the first reference voltage.

4. The word line defect detection circuit of claim 1, wherein the word line defect detection circuit is configured to operate with an initial voltage of the selected first word line set to the ground (GND) voltage, the sensing amplifier is configured to measure the measured voltage of the selected first word line according to the application of the detection reference current, in response to determining that the selected first word line is not defective, the word line defect detection circuit is configured to select, as a selected second word line, at least one of the plurality of word lines, and the current generating circuit is configured to apply the detection reference current to the selected second word line.

5. The word line defect detection circuit of claim 1, wherein the detection reference current is set to have a same magnitude as a magnitude of a leakage current to be detected from the selected first word line.

6. The word line defect detection circuit of claim 5, wherein in response to the detection reference current being applied, the word line defect detection circuit is configured to measure a first arrival time for the voltage of the selected first word line to reach the first reference voltage, and to set the first arrival time as a first reference for detecting whether the selected first word line is defective.

7. The word line defect detection circuit of claim 6, wherein in response to the detection reference current being applied, the word line defect detection circuit is configured to measure a second arrival time for the voltage of the selected first word line to reach the reference voltage, and in response to determining that the second arrival time is greater than the first reference, the word line defect detection circuit is configured to determine that the selected first word line is defective.

8. The word line defect detection circuit of claim 7, wherein in response to determining that the second arrival time is less than a second reference, the word line defect detection circuit is configured to determine that the selected first word line is in an open state.

9. A word line defect detection method that detects a defect of at least one selected first word line that is selected from a plurality of word lines of a memory device, the word line defect detection method comprising:

discharging the selected first word line;

generating a detection reference current having a first magnitude;

applying the detection reference current to the selected first word line to increase a voltage of the selected first word line in response to the selected first word line being discharged to a ground (GND) voltage;

measuring the voltage of the selected first word line increased and generated based on the detection reference current; and detecting a defect of the selected first word line upon determining that the voltage of the selected first word line has a value less than a reference voltage, wherein, in the detecting of the defect of the selected first word line, in response to the voltage of the selected first word line being equal to the reference voltage, the selected first word line is determined to not be defective.

10. The word line defect detection method of claim 9, wherein the generating of the detection reference current includes:

generating a first current from a first current source;

generating a second current from a second current source that forms a latch circuit with the first current source;

comparing an output current of the latch circuit with a first reference current; and, based on a comparison result, generating the detection reference current.

11. The word line defect detection method of claim 9, wherein the measuring of the voltage of the selected first word line includes:

dividing the voltage of the selected first word line into a divided voltage; and comparing the divided voltage of the selected first word line with the reference voltage.

12. The word line defect detection method of claim 9, further comprising:

setting an initial voltage of the selected first word line to the ground (GND) voltage;

wherein the measuring of the voltage of the selected first word line includes, upon determining that the selected first word line is not defective, selecting at least one second word line from the plurality of word lines and applying the detection reference current to the selected second word line.

13. The word line defect detection method of claim 9, wherein the generating of the detection reference current includes setting the detection reference current to have a same magnitude as a magnitude of a leakage current to be detected from the selected first word line.

14. The word line defect detection method of claim 13, wherein in response to the detection reference current being applied, the detecting of a defect of the selected word line includes:

measuring a first arrival time for the voltage of the selected word line to reach a reference voltage; and setting the first arrival time as a first reference for detecting whether the selected word line is defective.

15. The word line defect detection method of claim 14, wherein in response to a current exceeding the detection reference current being applied, the detecting of a defect of the selected first word line includes:

measuring a second arrival time for the voltage of the selected first word line to reach the reference voltage; and determining that the selected first word line is defective, in response to determining that the second arrival time is greater than the first reference.

16. The word line defect detection method of claim 15, further comprising:

determining that the selected first word line is in an open state, when it is determined that the second arrival time is less than a second reference.

17. A memory device including a circuit for detecting a defect of at least one selected word line among a plurality of word lines, the memory device comprising:

a current generating circuit configured to generate a detection reference current having a first magnitude and to apply the detection reference current to the selected word line in response to the selected first word line being discharged to at a ground (GND) voltage; and a sensing amplifier configured to measure a voltage of the selected word line generated based on the detection reference current, wherein in response to determining that the voltage of the selected word line has a value less than a first reference voltage, the memory device is configured to detect a defect of the selected word line.

18. The memory device of claim 17, wherein the current generating circuit includes:

a first current source;

a second current source configured to form a latch circuit with the first current source; and a first comparator configured to compare an output current from the latch circuit with a first reference current and, based on a result of the comparison, generate the detection reference current.

19. The memory device of claim 17, wherein the sensing amplifier includes:

a first capacitor;

a second capacitor connected to the first capacitor and configured to divide the measured voltage of the selected word line; and a second comparator configured to compare the divided voltage of the selected word line with the first reference voltage.

20. The memory device of claim 17, wherein an initial voltage of the selected word line is set to the ground (GND) voltage, and the sensing amplifier is configured to measure the voltage of the selected word line according to the application of the detection reference current.

* * * * *